(12) United States Patent
Aoki et al.

(10) Patent No.: US 6,335,887 B1
(45) Date of Patent: Jan. 1, 2002

(54) SEMICONDUCTOR MEMORY DEVICE ALLOWING SWITCHING OF WORD CONFIGURATION

(75) Inventors: Shigekazu Aoki; Seiji Sawada; Mikio Asakura; Takeshi Hamamoto; Masakazu Hirose, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/727,544

(22) Filed: Dec. 4, 2000

(30) Foreign Application Priority Data

May 29, 2000 (JP) .......................................... 12-158593

(51) Int. Cl.$^7$ .................................................. G11C 7/00
(52) U.S. Cl. .............. 365/201; 365/189.03; 365/230.06
(58) Field of Search .................................. 365/201, 191, 365/230.06, 194, 189.03, 120

(56) References Cited

U.S. PATENT DOCUMENTS 5,793,685 A * 8/1998 Suma ........................ 365/201
5,912,851 A * 6/1999 Matsuoka ................... 365/201
5,936,892 A * 8/1999 Wendell ................. 365/189.03
6,046,955 A * 4/2000 Suematsu et al. ....... 365/230.03

FOREIGN PATENT DOCUMENTS

| JP | 1-134790 | 5/1989 |
|---|---|---|
| JP | 11-2660 | 1/1999 |
| JP | 11-25698 | 1/1999 |

* cited by examiner

*Primary Examiner*—Trong Phan
*Assistant Examiner*—Thong Le
(74) *Attorney, Agent, or Firm*—McDermott, Will & Emery

(57) ABSTRACT

The semiconductor memory device has a word configuration determination signal generating circuit including a plurality of generating circuits, each of which is formed of two clocked inverters and two inverters. In a normal operation mode, a test mode signal TX4 is inactivated and a word configuration determination signal [x16E] of an H level is output. In a test mode, the test mode signal TX4 is activated and a word configuration determination signal [x4E] of an H level is output. Thus, in the test mode, the word configuration is switched to the one that is smaller than in the normal operation mode. This allows simultaneous testing of a larger number of semiconductor memory devices.

12 Claims, 20 Drawing Sheets

*FIG.2A*      *FIG.2B*      *FIG.2C*
FOR X4      FOR X8      FOR X16
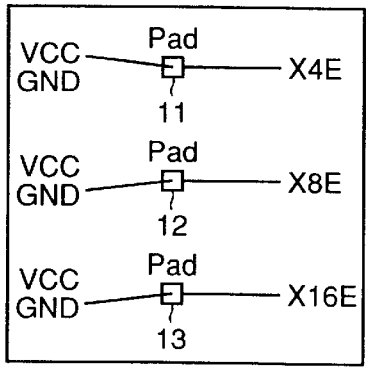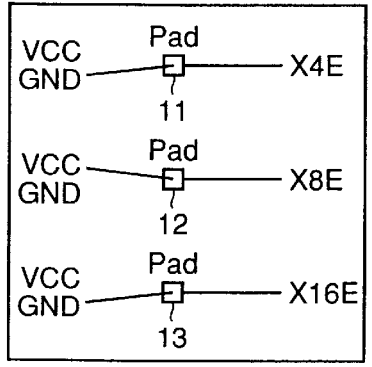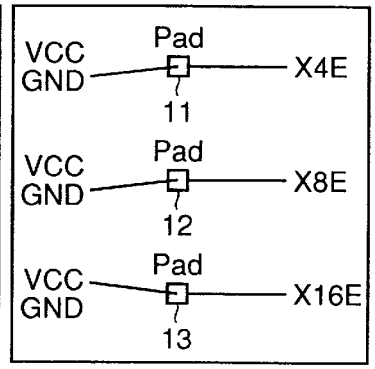

IN THE CASE OF X8

70 OR 71

SEMICONDUCTOR MEMORY DEVICE ALLOWING SWITCHING OF WORD CONFIGURATION

BACKGROUND OF THE INVENTION

1. Field of the Invention

The present invention relates to semiconductor memory devices, and more particularly, to a semiconductor memory device allowing an increased number of such devices to be tested simultaneously.

2. Description of the Background Art

A memory tester TST for testing semiconductor memory devices as shown in FIG. 23 includes a motherboard MBD. Motherboard MBD has a plurality of mounting portions 51 for respectively mounting a plurality of chips thereon, and a connecting portion 52 corresponding to the memory tester side. The number of chips to be mounted onto motherboard MBD is determined according to the number of I/Os that is limited by memory tester TST.

Conventionally, for a chip of dynamic random access memory (DRAM) of x32-bit configuration, the number of testable I/Os is 32. Memory tester TST limiting the number of I/Os to 64 can test two such chips at the same time.

However, if the number of input/output terminals being used increases due to an increase of memory integration or a change of interfaces, the number of chips for simultaneous testing has to be reduced. This decreases productivity of the semiconductor memory devices like DRAMs.

SUMMARY OF THE INVENTION

Accordingly, an object of the present invention is to provide a semiconductor memory device allowing an increased number of chips to be tested simultaneously.

The semiconductor memory device according to the present invention is a semiconductor memory device that allows selection of desired one of a plurality of word configurations. The semiconductor memory device includes: a test mode recognition circuit that inactivates a test mode signal in a normal operation mode and activates the test mode signal in response to an externally supplied test mode designating signal; a word configuration select circuit that selects, from a plurality of word configurations, a word configuration for use in the normal operation mode when receiving the inactive test mode signal from the test mode recognition circuit, and selects, from the plurality of word configurations, a word configuration that is smaller than that for use in the normal operation mode when receiving the active test mode signal from the test mode recognition circuit; and a terminal that inputs/outputs data to/from a memory cell array based on the word configuration selected by the word configuration select circuit.

According to the semiconductor memory device of the present invention, when the test mode signal is activated, the test is conducted selecting the word configuration that is smaller than that for use in the normal mode. Thus, a larger number of semiconductor memory devices can be mounted on a testing device and tested at the same time. As a result, it becomes possible to improve the throughput of testing of semiconductor memory devices.

Preferably, the semiconductor memory device further includes a word configuration determination signal generating circuit that generates a first word configuration determination signal when the inactive test mode signal is input from the test mode recognition circuit, and generates a second word configuration determination signal when the active test mode signal is input from the test mode recognition circuit. The word configuration select circuit selects the word configuration for use in the normal operation mode according to the first word configuration determination signal, and selects the word configuration that is smaller than that for use in the normal mode according to the second word configuration determination signal.

According to the semiconductor memory device of the present invention, when the test mode signal is activated, the test is conducted utilizing the word configuration that is smaller than that for use in the normal operation mode. Thus, it becomes possible to simultaneously mount a larger number of semiconductor memory devices on a testing device for testing. This improves the throughput of testing of semiconductor memory devices.

Still preferably, when the test mode signal is active, the word configuration determination signal generating circuit selects as a word configuration of the semiconductor memory device, the smallest word configuration from those selectable.

The test is thus conducted selecting the smallest possible word configuration. Accordingly, a maximum number of semiconductor memory devices can be mounted on the testing device, thereby maximizing the throughput of testing of the semiconductor memory devices.

The semiconductor memory device according to the present invention includes: m×n output terminals consisting of n short-circuited terminal groups each having m terminals being short-circuited in a test mode; a test mode recognition circuit that inactivates a test mode signal in a normal operation mode and activates the test mode signal in response to an externally supplied test mode designating signal; an output terminal select signal generating circuit that generates, when the test mode signal is active, a first output terminal select signal for causing data to be output from n output terminals each selected from respective one of the n short-circuited terminal groups, and generates, when the test mode is inactive, a second output terminal select signal for causing data to be output from the m×n output terminals; and an output terminal select circuit that selects either the n output terminals or the m×n output terminals according to the first or the second output terminal select signal generated.

For testing the semiconductor memory device having m×n output terminals, n output terminal groups are arranged, in each of which m output terminals are being short-circuited. Each one output terminal is selected from respective one of the n output terminal groups, and the n output terminals thus selected are used for the test. Accordingly, the semiconductor memory device can be tested with the number of output terminals reduced from m×n to n. As a result, it becomes possible to increase the number of semiconductor memory devices that can be mounted on the testing device simultaneously.

Preferably, the test mode recognition circuit inactivates all of m test mode signals in the normal operation mode, and activates any one of the m test mode signals in response to an externally supplied test mode designating signal. The output terminal select signal generating circuit generates, according to the m test mode signals, first and second output terminal select signals each made of m output terminal select signals. More specifically, when any one of the m test mode signals is activated, it generates the first output terminal select signal in which only one of the m output terminal select signals corresponding to the activated test mode signal is activated. When all the m test mode signals are inactivated, it generates the second output terminal select signal with all the m output terminal select signals being activated. The output terminal select circuit, when receiving the first output terminal select signal, selects n output terminals corresponding to the activated one of the m output terminal select signals.

Thus, the m output terminal select signals are generated corresponding to the m test mode signals. In the test mode, any one of the m test mode signals is activated, and the remaining test mode signals are inactivated. In response, only one output terminal select signal corresponding to the activated test mode signal is activated, and in turn, n output terminals are selected corresponding to the activated output terminal select signal. An output terminal select signal to be activated is changed by altering the one test mode signal to be activated among the m test mode signals. Different n output terminals are thus selected corresponding to the change of the output terminal select signal being activated. Meanwhile, in the normal operation mode, all the test mode signals are inactivated, the m output terminal select signals are all activated, so that the m×n output terminals are all selected.

As described above, every m output terminals are short-circuited to form n output terminal groups, and each one output terminal is selected from respective one of these n output terminal groups. Thus, n output terminals not short-circuited with each other are configured. The combination of these n, non-short-circuited output terminals changes sequentially for testing the memory cells. As a result, the test can be conducted with the number of output terminals being reduced from m×n to n, so that the number of semiconductor memory devices that can be simultaneously mounted on the testing device increases.

Preferably, the output terminal select circuit includes m×n output circuits connected to the m×n output terminals respectively. When the first output terminal select signal is input, the output terminal select circuit simultaneously activates n output circuits that correspond to the activated output terminal select signal.

The n output circuits being connected to the n output terminals selected in the test mode are simultaneously activated, so that data are output from the n output terminals. Accordingly, the data output from the n output terminals can be examined simultaneously, thereby allowing rapid testing.

Preferably, the semiconductor memory device further includes: a word configuration determination signal generating circuit that generates a word configuration determination signal for determining one word configuration from a plurality of word configurations; and a word configuration select circuit that selects a word configuration according to the word configuration determination signal. The number of the test mode signals is determined according to the word configuration selected by the word configuration select circuit.

In response to the determination of the word configuration, the number of the test mode signals is determined to conform to the word configuration. Accordingly, the test mode signals controlling the test mode can be generated in conformity with the word configuration. This allows precise testing.

Still preferably, the semiconductor memory device further includes an interface that inputs a data mask signal. The output terminal select signal generating circuit generates the first and the second output terminal select signals according to the test mode signal and the data mask signal.

When the semiconductor memory device externally receives the data mask signal along with the test mode designating signal, the first output terminal select signal, for selecting n non-short-circuited output terminals by selecting each one output terminal from respective one of the n output terminal groups each including m short-circuited output terminals, or the second output terminal select signal, for selecting the m×n output terminals, is generated based on the test mode signal and the data mask signal. Accordingly, it is possible to control the test mode using the data mask signal for use in the normal operation mode.

Preferably, the semiconductor memory device further includes: a word configuration determination signal generating circuit that generates a word configuration determination signal for determining one word configuration from a plurality of word configurations; and a word configuration select circuit that selects a word configuration according to the word configuration determination signal. The output terminal select signal generating circuit generates first and second output terminal select signals each made of a plurality of output terminal select signals. The number of output terminal select signals forming each of the first and second output terminal select signals is determined based on the word configuration selected by the word configuration select circuit.

When the word configuration is determined, the output terminal select signals are determined with its number conforming to the word configuration. Thus, the number of output terminal select signals for selecting output terminals for use in the test mode can be reduced, thereby allowing efficient testing.

Preferably, the semiconductor memory device includes: a word configuration determination signal generating circuit that generates a word configuration determination signal for determination of one of a plurality of word configurations; a test mode recognition circuit that inactivates a test mode signal in a normal operation mode and activates the test mode signal in response to an externally supplied test mode designating signal; a driver select/drive signal generating circuit that generates a driver select/drive signal for selecting and driving a write driver for use in writing data into a memory cell array, according to a column address signal prohibited in the normal operation mode, the test mode signal and the word configuration determination signal; and m write drivers that are respectively connected to m input/output terminals being short-circuited in the test mode. When the test mode signal is activated, the word configuration determination signal generating circuit generates a word configuration determination signal for fixing the word configuration of the semiconductor memory device to the word configuration for use in the normal operation mode, and the driver select/drive signal generating circuit generates the driver select/drive signal for selecting and driving the m write drivers one by one.

For the m input/output terminals being short-circuited in the test mode, such short-circuited conditions are cancelled and data are written into respective input/output terminals. Thus, even for the input/output terminals which are short-circuited in the test mode and for which cross interference due to the data writing cannot otherwise be measured, it becomes possible to examine such interference due to the data writing, thereby enabling accurate testing.

Preferably, the driver select/drive signal generating circuit generates a driver select/drive signal that allows switching of write drivers being selected and driven, based on the column address signal.

The column address signal is used to cancel the short-circuited conditions of the m input/output terminals being short-circuited in the test mode, and data are written via respective input/output terminals. Thus, data writing in the test mode can be controlled utilizing the column address signal that is prohibited in the normal operation mode.

Preferably, the semiconductor memory device further includes: m×n input/output terminals consisting of n short-circuited terminal groups each having m terminals being short-circuited in the test mode; an output terminal select signal generating circuit that generates, when the test mode signal is active, a first output terminal select signal for outputting data from n input/output terminals each of which is selected from respective one of the n short-circuited terminal groups, and generates, when the test mode signal is inactive, a second output terminal select signal for outputting data from the m×n input/output terminals; and an output terminal select circuit that selects, according to the first or second output terminal select signal, the n input/output terminals or the m×n input/output terminals.

For testing the semiconductor memory device, the short-circuited conditions of the m input/output terminals being short-circuited in the test mode are first cancelled, and data are written via respective input/output terminals. Each one output terminal is selected from respective one of the n output terminal groups each having m short-circuited terminals, and data are read out using thus selected n output terminals not short-circuited with each other. Accordingly, the cross interference among the m input/output terminals being short-circuited in the test mode can be examined with the number of input/output terminals being reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2A, 2B and 2C are wiring diagrams of a bonding pad unit shown in FIG. 1 when x4-bit, x8-bit and x16-bit word configurations are selected respectively.

DESCRIPTION OF THE PREFERRED EMBODIMENTS

Figure 1:
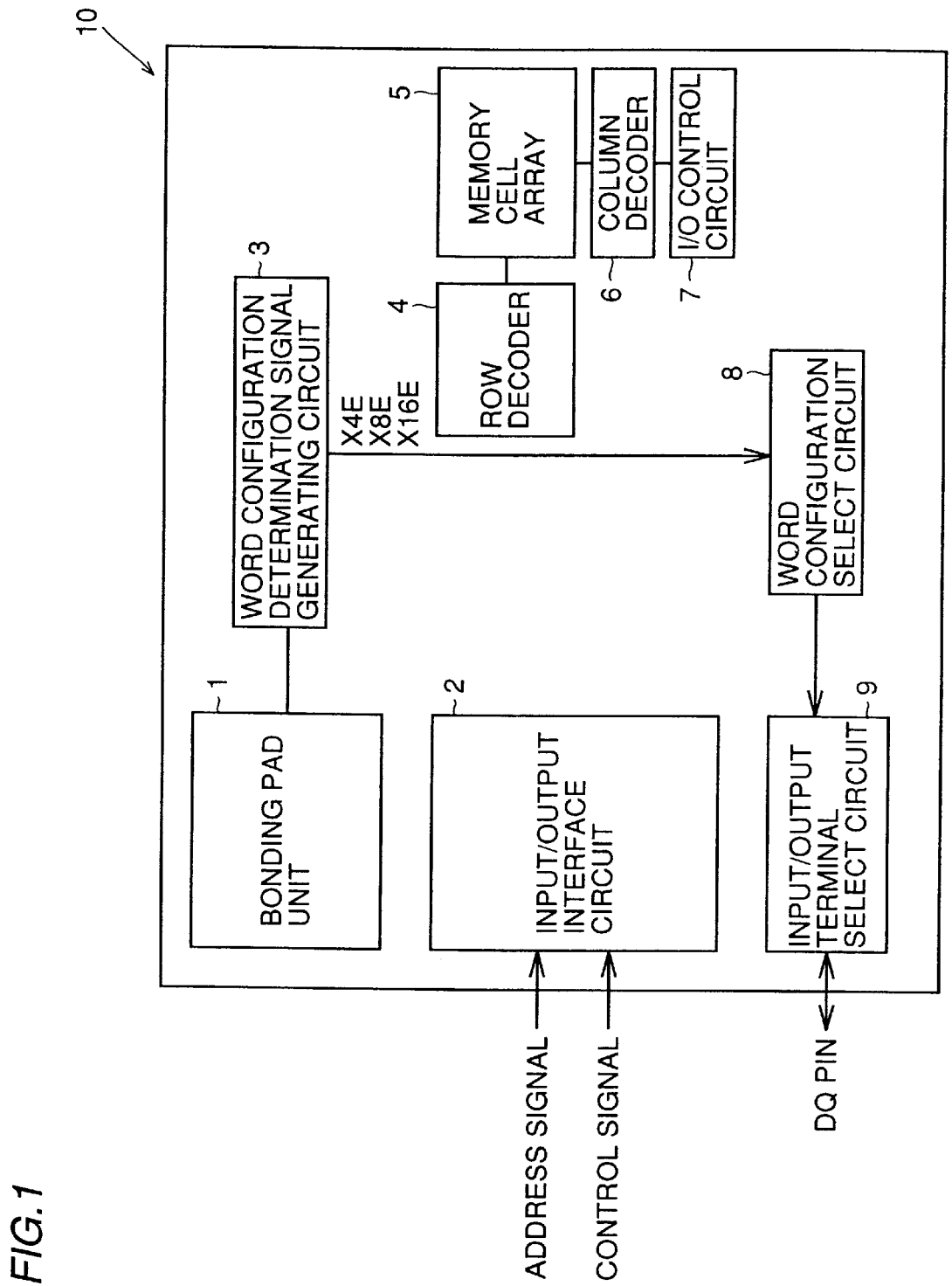
FIG. 1 is a schematic block diagram of a semiconductor memory device.

Hereinafter, embodiments of the present invention will be described in detail with reference to the drawings, in which same or corresponding portions are denoted by identical reference characters and description thereof will not be repeated.

First Embodiment

The semiconductor memory device according to the first embodiment will be described. Referring to FIG. 1, the semiconductor memory device 10 includes a bonding pad unit 1, an input/output interface circuit 2, a word configuration determination signal generating circuit 3, a row decoder 4, a memory cell array 5, a column decoder 6, an I/O control circuit 7, a word configuration select circuit 8, and an input/output terminal select circuit 9. Bonding pad unit 1 has a plurality of bonding pads, as will be described later, each pad being connectable to a high potential (VCC) or a ground potential (GND). Input/output interface circuit 2 inputs address and control signals, and applies the address signal to row decoder 4 and column decoder 6, and applies the control signal to I/O control circuit 7 and others. Word configuration determination signal generating circuit 3 is connected to bonding pad unit 1, and generates a word configuration determination signal for determination of a word configuration of semiconductor memory device 10 in a manner as will be described below. Row decoder 4 decodes a row address received from input/output interface circuit 2, and activates a word line of memory cell array 5 corresponding to the decoded row address. Column decoder 6 decodes a column address received from input/output interface circuit 2, and activates a bit line of memory cell array 5 corresponding to the decoded column address. Memory cell array 5 has a plurality of memory cells arranged in rows and columns. I/O control circuit 7 controls writing/reading of data to/from the memory cells included in memory cell array 5. Word configuration select circuit 8 selects a word configuration based on the word configuration determination signal ([x4E], [x8E], [x16E]) from word configuration determination signal generating circuit 3. Input/output terminal select circuit 9 selects, based on the select result of word configuration select circuit 8, an input/output terminal corresponding to the selected word configuration.

Referring to FIGS. 2A–2C, a way to determine the word configuration in semiconductor memory device 10 will be described. Bonding pad unit 1 has pads 11–13, each of which is connectable to a high potential (VCC) or a ground potential (GND). For selection of a x4-bit word configuration, pad 11 is connected to high potential VCC and pads 12 and 13 are connected to ground potential GND. For an x8-bit word configuration, pad 12 is connected to high potential VCC, and pads 11, 13, to ground potential GND. For a x16-bit word configuration, pad 13 is connected to high potential VCC and pads 11, 12, to ground potential GND. Thus, when the x4-bit word configuration is being selected, signal [x4E] is at an H aogical high) level and signals [x8E] and [x16E] are at an L (logical low) level. When selecting the x8-bit word configuration, signal [x8E] is at an H level and signals [x4E] and [x16E] are at an L level. Further, when selecting the x16-bit word configuration, signal [x16E] is at an H level and signals [x4E] and [x8E] are at an L level.

In semiconductor memory device 10, its word configuration is determined before shipment in the manner as described above, by connecting respective pads 11–13 to either high potential VCC or ground potential GND depending on the x4-, x8- or x16-bit word configuration to be achieved.

Returning to FIG. 1, word configuration determination signal generating circuit 3 receives signals [x4E, x8E, x16E], either one being at an H level, from bonding pad unit 1. It then generates a word configuration determination signal [x4E], when [x4E] =H, [x8E]=L and [x16E]=L, to fix the word configuration of semiconductor memory device 10 to the x4-bit word configuration. It generates word configuration determination signal [x8E], when [x4E]=L, [x8E]=H and [x16E]=L, to fix it to the x8-bit word configuration, and generates word configuration determination signal [x16E], when [x4E]=L, [x8E]=L and [x16E]=H, to fix it to the x16-bit word configuration.

Word configuration select circuit 8 selects a word configuration based on the word configuration determination signal ([x4E], [x8E], [x16E]) output from word configuration determination signal generating circuit 3. Input/output terminal select circuit 9 then selects an input/output terminal corresponding to the word configuration selected by word configuration select circuit 8. Thus, data writing/reading for memory cell array 5 is conducted according to the word configuration determined.

Thus, semiconductor memory device 10 is of the kind that can select and use an arbitrary word configuration from a plurality of word configurations (x4, x8, x16).

Figure 3:
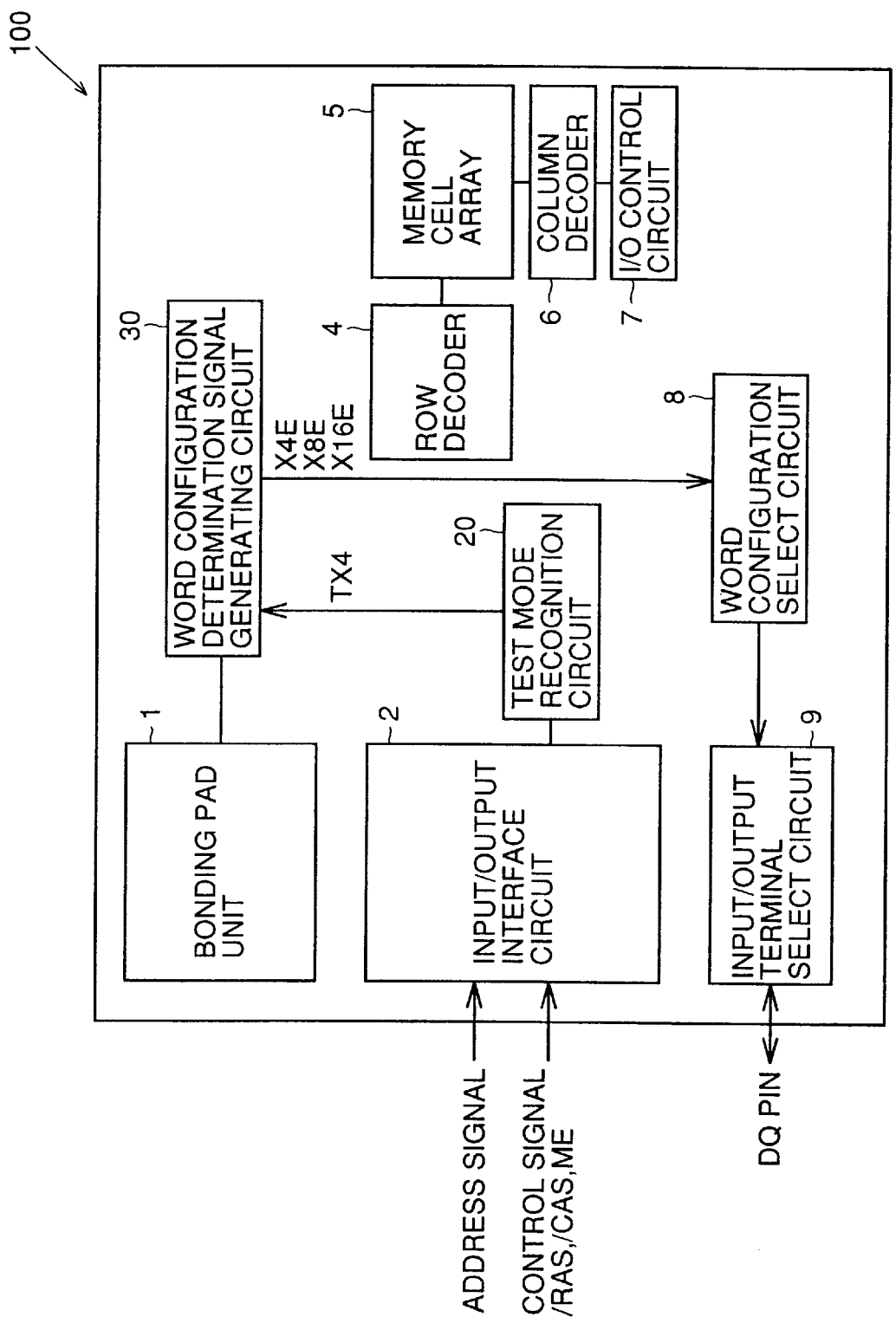
FIG. 3 is a schematic block diagram of a semiconductor memory device according to a first embodiment of the present invention.

The semiconductor memory device according to the first embodiment will be described. Referring to FIG. 3, the semiconductor memory device 100 is the same as semiconductor memory device 10 except that word configuration determination signal generating circuit 3 is replaced by word configuration determination signal generating circuit 30 and a test mode recognition circuit 20 is added thereto. Test mode recognition circuit 20, when receiving a row address strobe signal /RAS of an L level, a column address strobe signal /CAS of an L level, a mode entry signal ME of an L level and an address signal having a particular value from input/output interface circuit 2, causes semiconductor memory device 100 to move to a test mode, and outputs an activated test mode signal TX4 to word configuration determination signal generating circuit 30. In the non-test mode, test mode recognition circuit 20 outputs an inactivated test mode signal TX4 to word configuration determination signal generating circuit 30.

Figure 4:
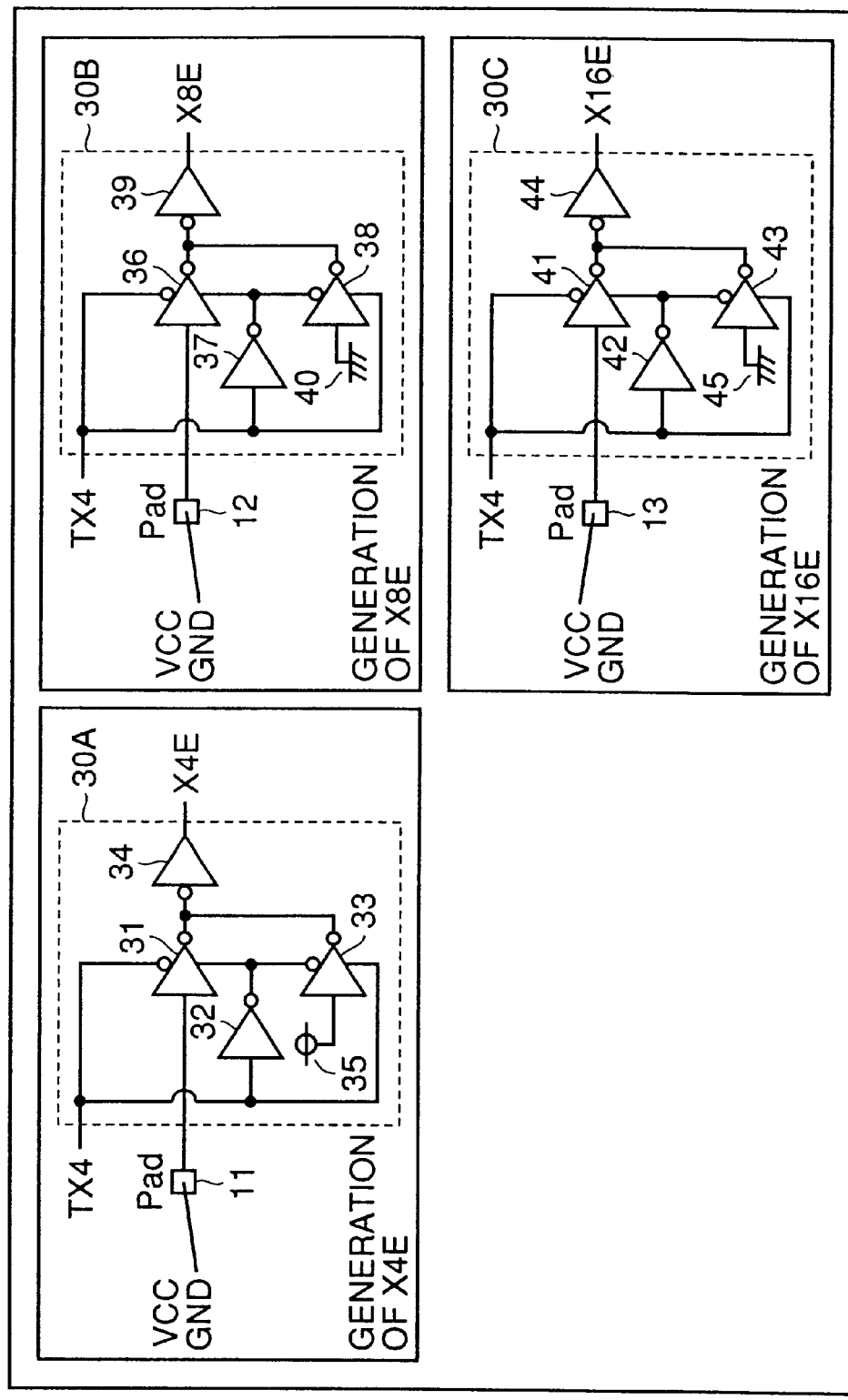
FIG. 4 is a circuit diagram of a word configuration determination signal generating circuit shown in FIG. 3.

Referring to FIG. 4, pads 11, 12 are connected to ground potential GND and pad 13 is connected to high potential VCC. In other words, FIG. 4 shows the case in which the word configuration for use in a normal operation mode is that of x16bits. Word configuration determination signal generating circuit 30 includes generating circuits 30A, 30B and 30C. Generating circuit 30A is formed of clocked inverters 31, 33, and inverters 32, 34, and the input terminal of clocked inverter 33 is connected to a power supply terminal 35. Similarly, generating circuit 30B is formed of clocked inverters 36, 38 and inverters 37, 39, with clocked inverter 38 having its input terminal connected to ground terminal 40. Generating circuit 30C is formed of clocked inverters 41, 43 and inverters 42, 44, with clocked inverter 43 having its input terminal connected to ground terminal 45.

In generating circuit 30A, when activated test mode signal TX4 (TX4: H level) is input and a signal of an L level is output from pad 11, then clocked inverter 31 is turned off and clocked inverter 33 is turned on. Thus, generating circuit 30A outputs word configuration determination signal [x4E] of an H level. Conversely, if inactivated test mode signal TX4 (TX4: L level) is input and a signal of an L level is output from pad 11, then clocked inverter 31 is turned on and clocked inverter 33 is turned off. Thus, in this case, generating circuit 30A outputs word configuration determination signal [x4E] of an L level.

In generating circuit 30B, a signal of an L level is output from pad 12 and the input terminal of clocked inverter 38 is connected to ground terminal 40. Thus, generating circuit 30B outputs word configuration determination signal [x8E] of an L level, regardless of whether test mode signal TX4 is activated (TX4: H level) or inactivated (TX4: L level).

In generating circuit 30C, a signal of an H level is output from pad 13 and the input terminal of clocked inverter 43 is connected to ground terminal 45. Thus, generating circuit 30C outputs word configuration determination signal [x16E] of an L level if activated test mode signal TX4 (H level) is input, and outputs word configuration determination signal [x16E] of an H level if inactivated test mode signal TX4 (L level) is input.

Accordingly, when test mode signal TX4 is inactivated, i.e., in a normal operation mode, word configuration determination signal generating circuit 30 outputs word configuration determination signal [x16E] to fix the word configuration of semiconductor memory device 100 to the x16-bit word configuration, based on word configuration determination signal [x4E] of an L level output from generating circuit 30A, word configuration determination signal [x8E] of an L level output from generating circuit 30B, and word configuration determination signal [x16E] of an H level output from generating circuit 30C. On the contrary, when test mode signal TX4 is activated, i.e., in a test mode, word configuration determination signal generating circuit 30 outputs word configuration determination signal [x4E] to fix the word configuration of semiconductor memory device 100 to that of x4 bits, based on word configuration determination signal [x4E] of an H level output from generating circuit 30A, word configuration determination signal [x8E]

of an L level output from generating circuit 30B, and word configuration determination signal [x16E] of an L level output from generating circuit 30C.

Returning to FIG. 3, when word configuration determination signal [x4E] or [x16E] is output from word configuration determination signal generating circuit 30, word configuration select circuit 8 selects a x4-bit or x16-bit word configuration based on the received word configuration determination signal [x4E] or [x16E]. Input/output terminal select signal 9 then selects input/output terminals in conformity with the x4-bit word configuration or those in conformity with the x16-bit word configuration. Thus, semiconductor memory device 100 is of the kind that allows its word configuration to be switched between the x16-bit word configuration in a normal operation mode and the x4-bit word configuration in a test mode.

In semiconductor memory device 100, in a normal operation mode, writing/reading of data to/from the memory cell array is performed via input/output terminals using the x16-bit word configuration. In a test mode, normal testing is performed by switching the word configuration from the x16-bit word configuration to the x4-bit word configuration.

TABLE 1

| Data Bus | Word Configuration | | |
|---|---|---|---|
|  | X16 | X8 | X4 |
| DB0 | DQ0 | DQ0 | DQ0 |
| DB1 | DQ1 |  |  |
| DB2 | DQ2 | DQ1 |  |
| DB3 | DQ3 |  |  |
| DB4 | DQ4 | DQ2 | DQ1 |
| DB5 | DQ5 |  |  |
| DB6 | DQ6 | DQ3 |  |
| DB7 | DQ7 |  |  |
| DB8 | DQ8 | DQ4 | DQ2 |
| DB9 | DQ9 |  |  |
| DB10 | DQ10 | DQ5 |  |
| DB11 | DQ11 |  |  |
| DB12 | DQ12 | DQ6 | DQ3 |
| DB13 | DQ13 |  |  |
| DB14 | DQ14 | DQ7 |  |
| DB15 | DQ15 |  |  |

Figure 5:
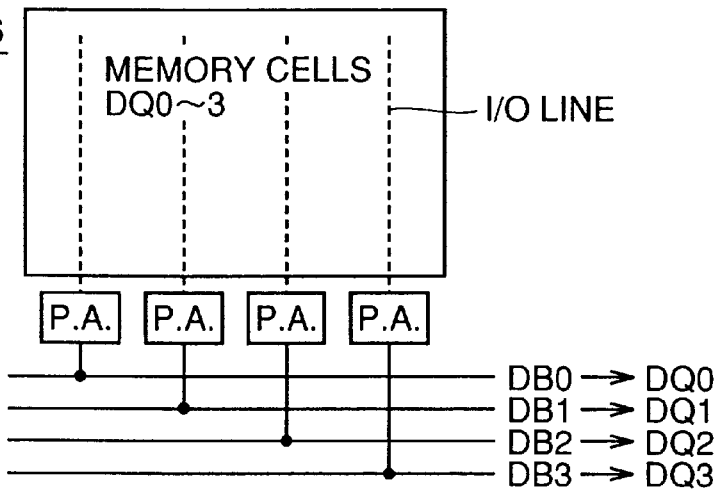
FIG. 5 schematically shows relations between memory cells and input/output terminals in the case of x16-bit word configuration.

As shown in Table 1, input/output terminals DQ0–DQ15 are utilized in the case of x16 word configuration; whereas, input/output terminals DQ0–DQ3 are utilized in the x4 word configuration. Input/output terminal DQ0 in the case of x4-bit word configuration takes charge of data input to or output from input/output terminals DQ0–DQ3 in the case of x16-bit word configuration. Similarly, input/output terminals DQ1, DQ2 and DQ3 in the case of x4-bit word configuration take charge of data input to or output from input/output terminals DQ4–DQ7, DQ8–DQ11 and DQ12–DQ15 in the case of x16-bit word configuration, respectively. More specifically, referring to FIGS. 5 and 6, data read from memory cells, which correspond to data being input/output via input/output terminals DQ0–3 in the case of x16-bit word configuration, are output via read amplifiers (P.A.) to data buses DB0–3, respectively and independently from each other, and then output to corresponding input/output terminals DQ0–3. Likewise, data writing to memory cells are conducted via data buses DB0–3 corresponding to input/output terminals DQ0–3, respectively and independently from each other.

When the word configuration is switched from x16 bits to x4 bits, the memory cells that have been connected to input/output terminals DQ0–3 in the x16-bit word configuration are now connected to a single data bus DB0 in the x4-bit word configuration, and data input/output is conducted through a single input/output terminal DQ0. Likewise, the memory cells having been connected to input/output terminals DQ4–7 in the x16-bit word configuration are all connected to a single data bus DB1 in the x4-bit word configuration and data is input/output through a single input/output terminal DQ1. The memory cells having been connected to input/output terminals DQ8–11 in the x16-bit word configuration are all connected to a single data bus DB2 in the x4-bit word configuration and data is input/output through a single input/output terminal DQ2. Further, the memory cells having been connected to input/output terminals DQ12–15 in the x16-bit word configuration are all connected to a single data bus DB3 in the x4-bit word configuration and data is input/output through a single input/output terminal DQ3. Thus, even if the word configuration is switched from the x16 bits to the x4 bits and the number of input/output terminals to be tested in semiconductor memory device 100 is reduced from 16 to 4, data writing and reading are conducted for all the memory cells. Therefore, the quality of the test itself is not degraded.

Accordingly, it is possible to test a semiconductor memory device having a x16-bit word configuration in a normal operation mode by switching the word configuration to that of x4 bits in a test mode, thereby reducing the number of input/output terminals from 16 to 4. As a result, an increased number of semiconductor devices can be mounted on a tester at the same time, and thus, the throughput of the semiconductor device testing can be increased.

The present embodiment has been described above, taking the case in which the semiconductor memory device of the x16-bit word configuration in a normal operation mode is being switched to the x4-bit word configuration in a test mode. However, referring to FIG. 4, suppose that pad 12 is connected to high potential VCC and pad 13 is connected to ground potential GND, respectively. Then, the semiconductor memory device of x8-bit word configuration in a normal operation mode can be tested by switching its word configuration from the 8 bits to the 4 bits. In this case, as shown in Table 1, input/output terminal DQ0 in the x4-bit word configuration takes charge of data input/output through input/output terminals DQ0, 1 in the x8-bit word configuration. Likewise, input/output terminals DQ1, DQ2 and DQ3 in the x4-bit word configuration respectively take charge of data input/output through input/output terminals DQ2, 3; DQ4, 5; and DQ6, 7, in the x8-bit word configuration. More specifically, referring to FIGS. 6 and 7, data read from memory cells, which correspond to data input/output through input/output terminals DQ0, 1 in the x8-bit word configuration, are output to data buses DB0, 1 via read amplifiers (. A.), respectively and independently from each other, and output through corresponding to input/output terminals DQ0, 1. Similarly, data writing to the memory cells are performed using data buses DB0, 1 corresponding to input/output terminals DQ0, 1, respectively and independently from each other.

When the word configuration is switched from x8 bits to x4 bits, the memory cells having been connected to input/output terminals DQ0, 1 in the x8-bit word configuration are all connected to a single data bus DB0 in the x4-bit word configuration, and data input/output is conducted through a single input/output terminal DQ0. Likewise, the memory cells having been connected to input/output terminals DQ2, 3 in the x8-bit word configuration are all connected to a single data bus DB1 in the x4-bit word configuration, and data is input/output via a single input/output terminal DQ1.

The memory cells having been connected to input/output terminals DQ4, 5 in the x8-bit word configuration are all connected to one data bus DB 2 in the x4-bit word configuration, and data is input/output via one input/output terminal DQ2. Further, the memory cells having been connected to input/output terminals DQ6, 7 in the x8-bit word configuration are all connected to one data bus DB3 in the x4-bit word configuration, and data is input/output via one input/output terminal DQ3. Therefore, even if semiconductor memory device 100 is tested with the number of input/output terminals being reduced from 8 to 4 by switching the word configuration from x8 bits to x4 bits, data writing/reading is done for all the memory cells. Thus, degradation in quality of the test itself is prevented.

As described above, according to the configuration of the first embodiment, the word configuration of a semiconductor memory device can be switched from the one for use in a normal operation mode, to another one of a smaller number of bits for testing. Therefore, it is possible to increase the number of semiconductor memory devices to be mounted on a tester at the same time. The throughput of the semiconductor memory device testing is thus improved.

Second Embodiment

Figure 8:
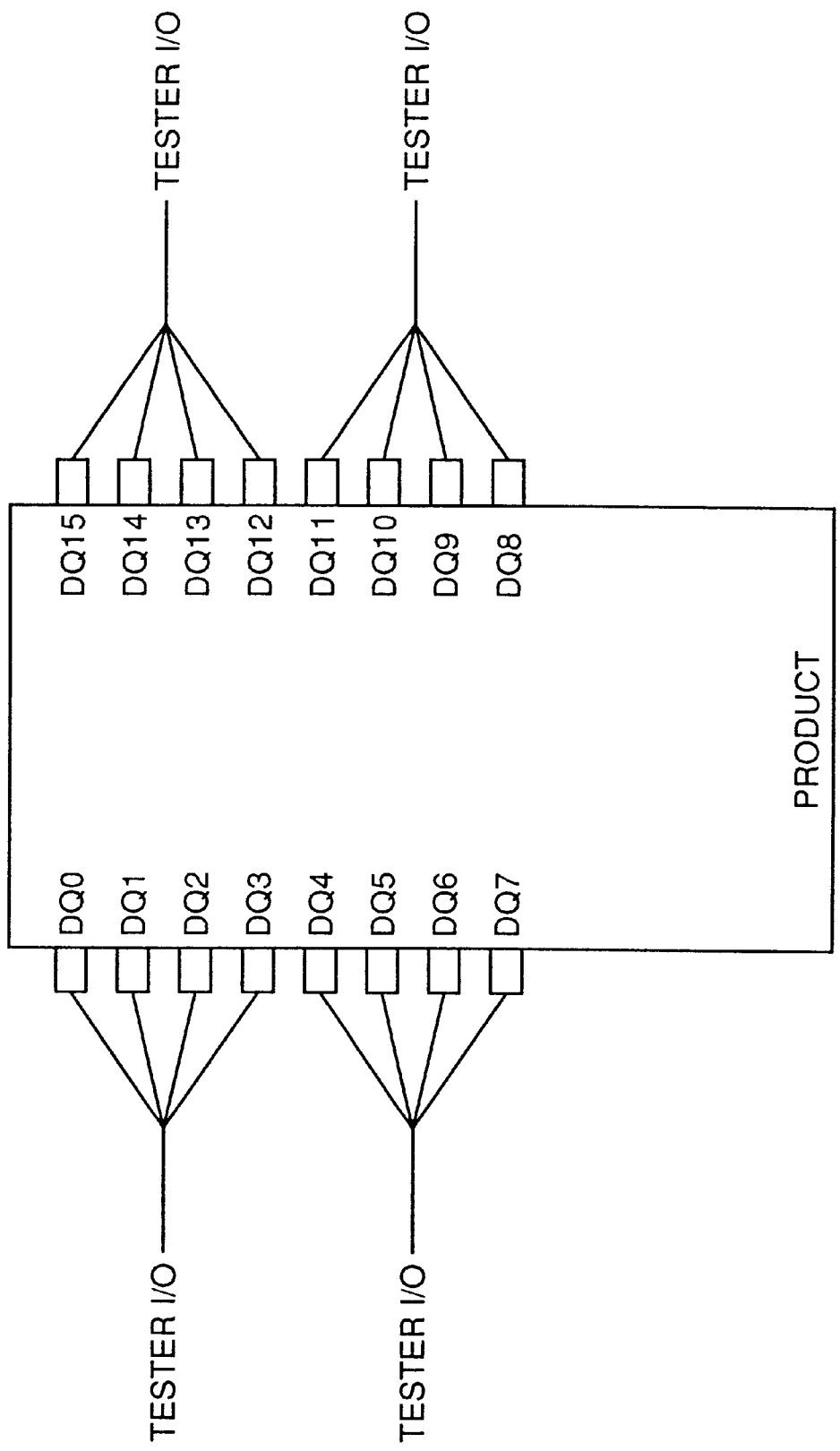
FIG. 8 is an outline view of a semiconductor memory device according to a second embodiment of the present invention.

The second embodiment of the present invention will now be described. Referring to FIG. 8, the semiconductor memory device of the x16-bit word configuration has 16 input/output terminals DQ0–DQ15, of which input/output terminals DQ0–3 are short-circuited and connected to one I/O terminal of a tester, input/output terminals DQ4–7 are short-circuited and connected to another I/O terminal of the tester, input/output terminals DQ8–11 are short-circuited and connected to still another I/O terminal of the tester, and input/output terminals DQ12–15 are short-circuited and connected to yet another I/O terminal of the tester. In other words, every four of 16 input/output terminals are short-circuited and connected to respective one of the I/O terminals of the tester, for performing a data reading test.

Figure 9:
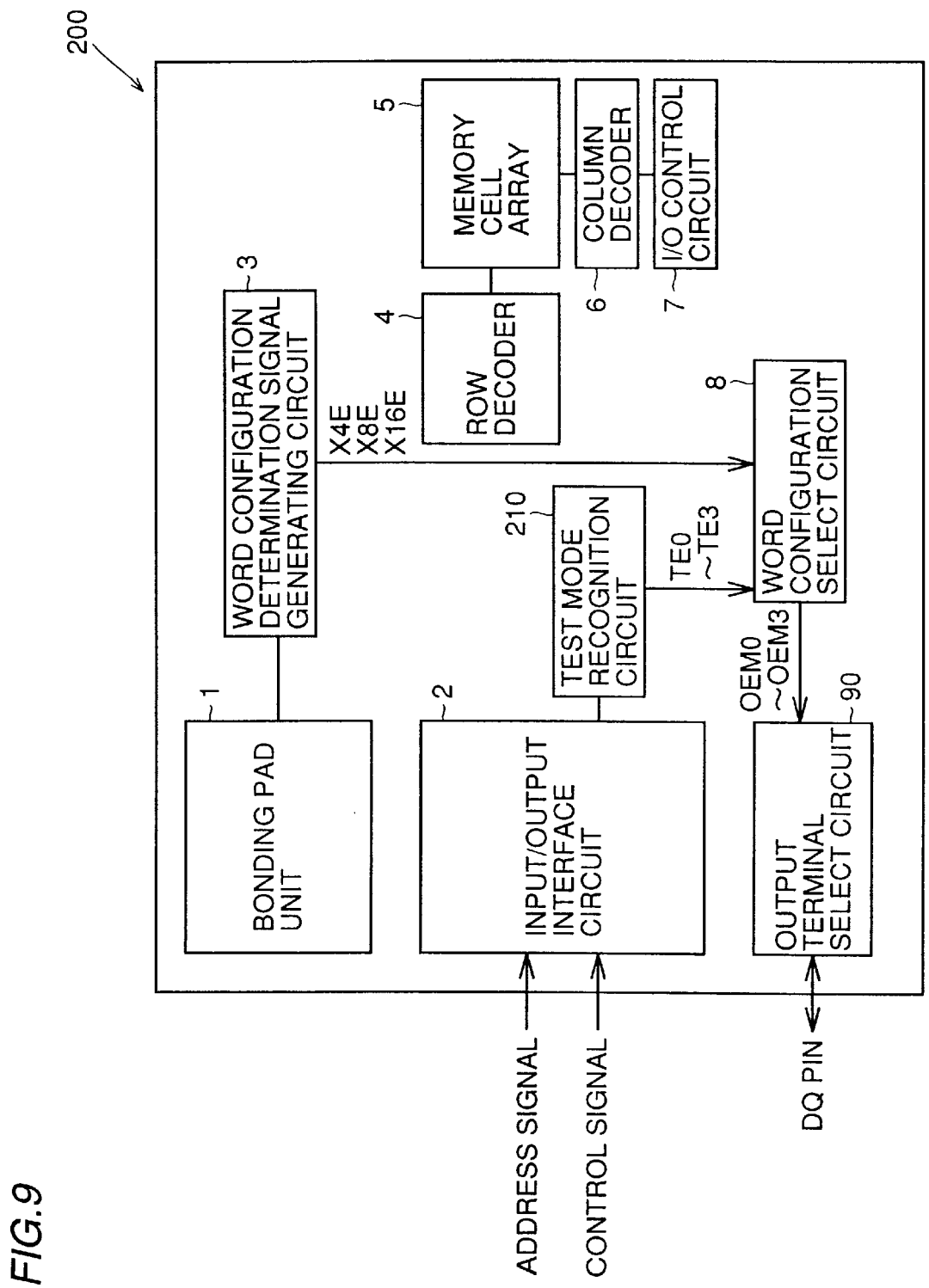
FIG. 9 is a schematic block diagram of the semiconductor memory device according to the second embodiment.

Referring to FIG. 9, the semiconductor memory device 200 according to the second embodiment is identical to semiconductor memory device 10 shown in FIG. 1, except that input/output terminal select circuit 9 is replaced by an input/output terminal select circuit 90 and a test mode recognition circuit 210 is added thereto. Test mode recognition circuit 210, when receiving a row address strobe signal /RAS of an L level, a column address strobe signal /CAS of an L level, a mode entry signal ME of an L level, and also an address signal of a particular level from input/output interface circuit 2, causes semiconductor memory device 200 to move to a test mode, and outputs, to word configuration select circuit 8, test mode signals TE0–3 with any one of them being activated (to an H level). In the non-test mode, test mode recognition circuit 210 outputs, to word configuration select circuit 8, test mode signals TE0–3 all inactivated (to an L level).

Word configuration select circuit 8 selects the word configuration of x16 bits for semiconductor memory device 200, based on word configuration determination signal [x16E] from word configuration determination signal generating circuit 3, as described above. It also generates output terminal select signals OEM0–3, based on test mode signals TE0–3 from test mode recognition circuit 210.

Figure 10:
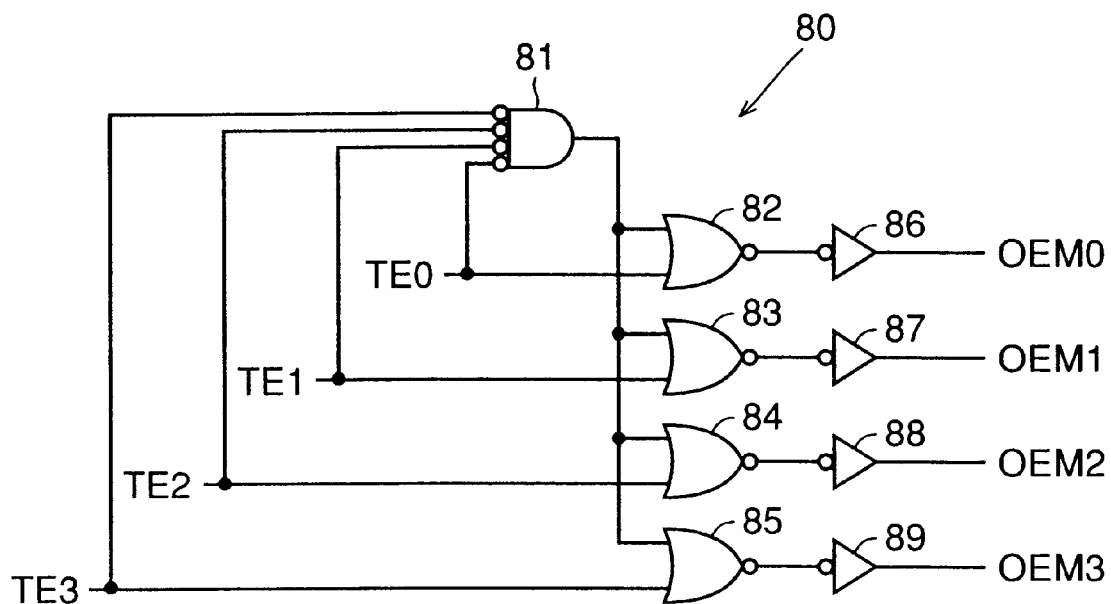
FIG. 10 is a circuit diagram of an output circuit select signal generating circuit.

Word configuration select circuit 8 includes an output terminal select signal generating circuit 80 as shown in FIG. 10. Output terminal select signal generating circuit 80 includes a 4-input NOR gate (negative logic) 81, NOR gates 82–85, and inverters 86–89. Of test mode signals TE0–3, when only test mode signal TE0 is active, i.e., TE0=H level, TE1=L level, TE2=L level and TE3=L level, then OEM0=H level and OEM1=OEM2=OEM3=L level. If only test mode signal TE1 is active, i.e., TE0=L level, TE1=H level, TE2=L level and TE3=L level, then OEM1=H level and OEM0=OEM2=OEM3=L level. When only test mode signal TE2 is active, i.e., TE0=L level, TE1=L level, TE2=H level and TE3=L level, then OEM2=H level and OEM0=OEM1=OEM3=L level. If only test mode signal TE3 is active, i.e., TE0=L level, TE1=L level, TE2=L level and TE3=H level, then OEM3=H level and OEM0=OEM1=OEM2=L level.

If test mode signals TE0–3 are all at an L level, then OEM0–3 all attain an H level.

Figure 11:
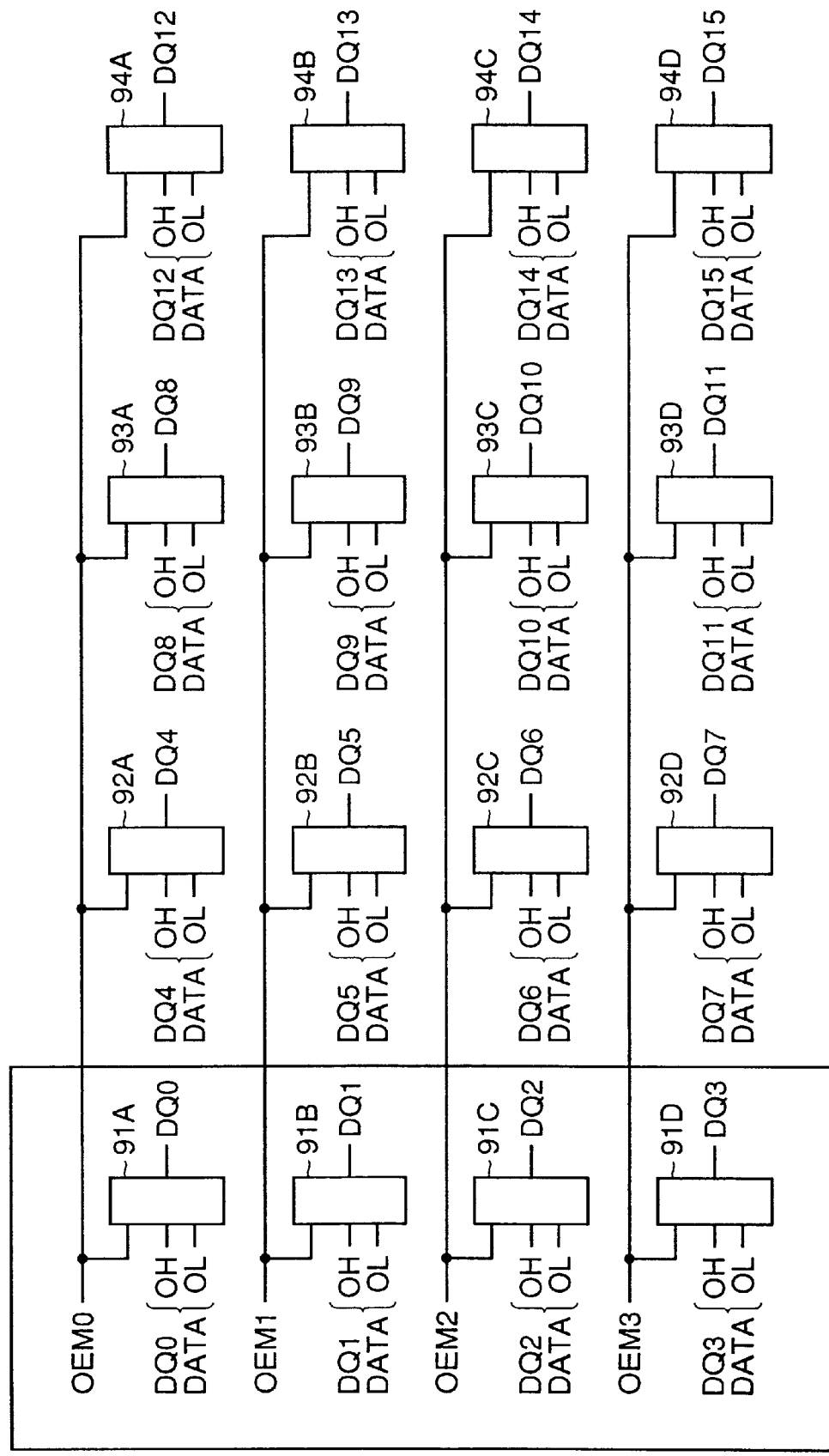
FIG. 11 is a circuit diagram of an output terminal select circuit.

Output terminal select circuit 90 has output circuits 91A–91D, 92A–92D, 93A–93D and 94A–94D, shown in FIG. 11. Output circuits 91A–91D are connected to output terminals DQ0–3, respectively. These output terminals DQ0–3 are short-circuited in the test mode. Similarly, output circuits 92A–92D are respectively connected to output terminals DQ4–7, which are short-circuited in the test mode. Output circuits 93A–93D are respectively connected to output terminals DQ8–11, which are short-circuited in the test mode. Output circuits 94A–94D are respectively connected to output terminals DQ12–14, which are short-circuited in the test mode.

Output circuits 91A, 92A, 93A and 94A are activated when output terminal select signal OEM0 is at an H level. Likewise, output circuits 91B, 92B, 93B and 94B are activated when output terminal select signal OEM1 is at an H level; output circuits 91C, 92C, 93C and 94C are activated when output terminal select signal OEM2 is at an H level; and output circuits 91D, 92D, 93D and 94D are activated when output terminal select signal OEM3 is at an H level.

Figure 12:
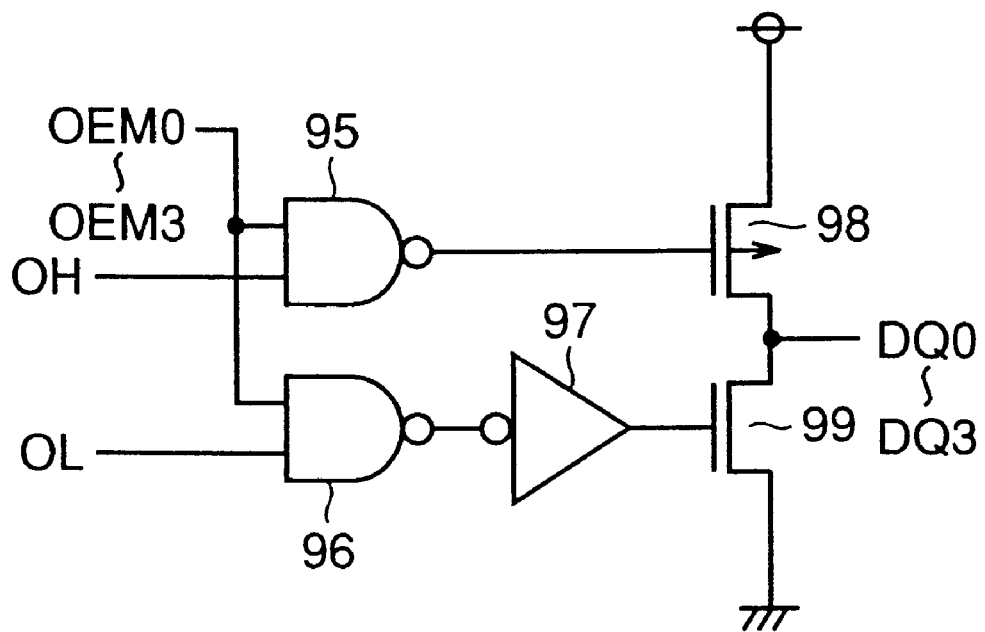
FIG. 12 is a circuit diagram of an output circuit.

Referring to FIG. 12, output circuits 91A–91D, 92A–92D, 93A–93D and 94A–94D each have NAND gates 95, 96, an inverter 97, and N channel MOS transistors 98, 99. When output terminal select signal OEM0 is activated, if OH=H level and OL=L level, then data of an H level is output from output terminal DQ0, and if OH=L level and OL=H level, then data of an L level is output from output terminal DQ0. In other words, when output terminal select signal OEM0 is activated, only output circuit 91A out of output circuits 91A, 91B, 91C and 91D that are connected to input/output terminals DQ0–3 being short-circuited in the test mode is activated, and outputs data to input/output terminal DQ0–Similarly, when output terminal select signal OEM1 is activated, of the output circuits 91A, 91B, 91C and 91D that are connected to input/output terminals DQ0–3 being short-circuited in the test mode, only output circuit 91B is activated to output data to input/output terminal DQ1. When output terminal select signal OEM2 is activated, of the output circuits 91A, 91B, 91C and 91D that are connected to input/output terminals DQ0–3 being short-circuited in the test mode, only output circuit 91C is activated and outputs data to input/output terminal DQ2. When output terminal select signal OEM3 is activated, of the output circuits 91A, 91B, 91C and 91D that are connected to input/output terminals DQ0–3 being short-circuited in the test mode, only output circuit 91D is activated to output data to input/output terminal DQ3.

Returning to FIG. 11, by activating output terminal select signal OEM0 out of output terminal select signals OEM0–3, input/output terminals DQ0, 4, 8 and 12 are respectively selected from input/output terminals DQ0–3, DQ4–7, DQ8–11 and DQ12–15 that are being short-circuited in the test mode, and data are read out from input/output terminals DQ0, 4, 8 and 12 thus selected. Likewise, by activating output terminal select signal OEM1 out of output terminal select signals OEM0–3, input/output terminals DQ1, 5, 9 and 13 are respectively selected from input/output terminals DQ0–3, DQ4–7, DQ8–11 and DQ12–15 that are being short-circuited in the test mode, and data are read out from selected input/output terminals DQ1, 5, 9 and 13. Further, when output terminal select signal OEM2 is activated among output terminal select signals OEM0–3, input/output terminals DQ2, 6, 10 and 14 are respectively selected from input/output terminals DQ0–3, DQ4–7, DQ8–11 and DQ12–15 that are being short-circuited in the test mode, and data are read out from input/output terminals DQ2, 6, 10 and 14. Still further, by activating output terminal select signal OEM3 out of output terminal select signals OEM0–3, input/output terminals DQ3, 7, 11 and 15 are respectively selected from input/output terminals DQ0–3, DQ4–7, DQ8–11 and DQ12–15 that are being short-circuited in the test mode, and data are read out from thus selected input/output terminals DQ3, 7, 11 and 15.

In the normal operation mode, by activating all the output terminal select signals OEM0–3, output circuits 91A–91D, 92A–92D, 93A–93D and 94A–94D are all activated, so that data can be output from all input/output terminals DQ0–15.

Thus, in semiconductor memory device 200, in response to reception of externally supplied test mode designating signals, test mode recognition circuit 210 activates any one of test mode signals TE0–3 and outputs the test mode signals TE0–3 to word configuration select circuit 8. Consequently, output terminal select signal generating circuit 80 included in word configuration select circuit 8 generates output terminal select signals OEM0–3, by activating any one of them based on test mode signals TE0–3 of which any one has been activated, and outputs the output terminal select signals OEM0–3 to output terminal select circuit 90. Based on thus received output terminal select signals OEM0–3 of which any one has been activated, output terminal select circuit 90 activates output circuits (any one from 91A–91D, 92A–92D, 93A–93D and 94A–94D, respectively) corresponding to the activated output terminal select signal (any one of OEM0–3). By sequentially changing output terminal select signals OEM0–3 being activated according to test mode signals TE0–3, output circuits 91A–91D, 92A–92D, 93A–93D and 94A–94D being activated can be sequentially changed, so that data can be read out from all 16 output terminals. As a result, data can be read out from semiconductor memory device 200 having 16 output terminals, through four I/Os of the tester. Therefore, it is possible to read out data in the test mode, by reducing the number of output terminals from 16 to 4.

Although the semiconductor memory device having 16 output terminals has been used for explanation, the same applies to the semiconductor memory device having eight output terminals. In this case, again, the output terminals are short-circuited for reading data, and thus, it is possible to perform the test with a reduced number of output terminals.

The semiconductor memory device according to the second embodiment may be of the kind that incorporates configurations of both the semiconductor memory device performing-a test by selecting a smaller word configuration as in the first embodiment and the semiconductor memory device reading out data using four I/Os of the tester from four short-circuited output terminals as in the second embodiment.

Thus, according to the configuration of the second embodiment, a test can be conducted with a reduced number of input/output terminals. This allows a larger number of semiconductor memory devices to be mounted on a tester at the same time, thereby improving the throughput of the test of semiconductor memory devices.

Third Embodiment

Figure 13:
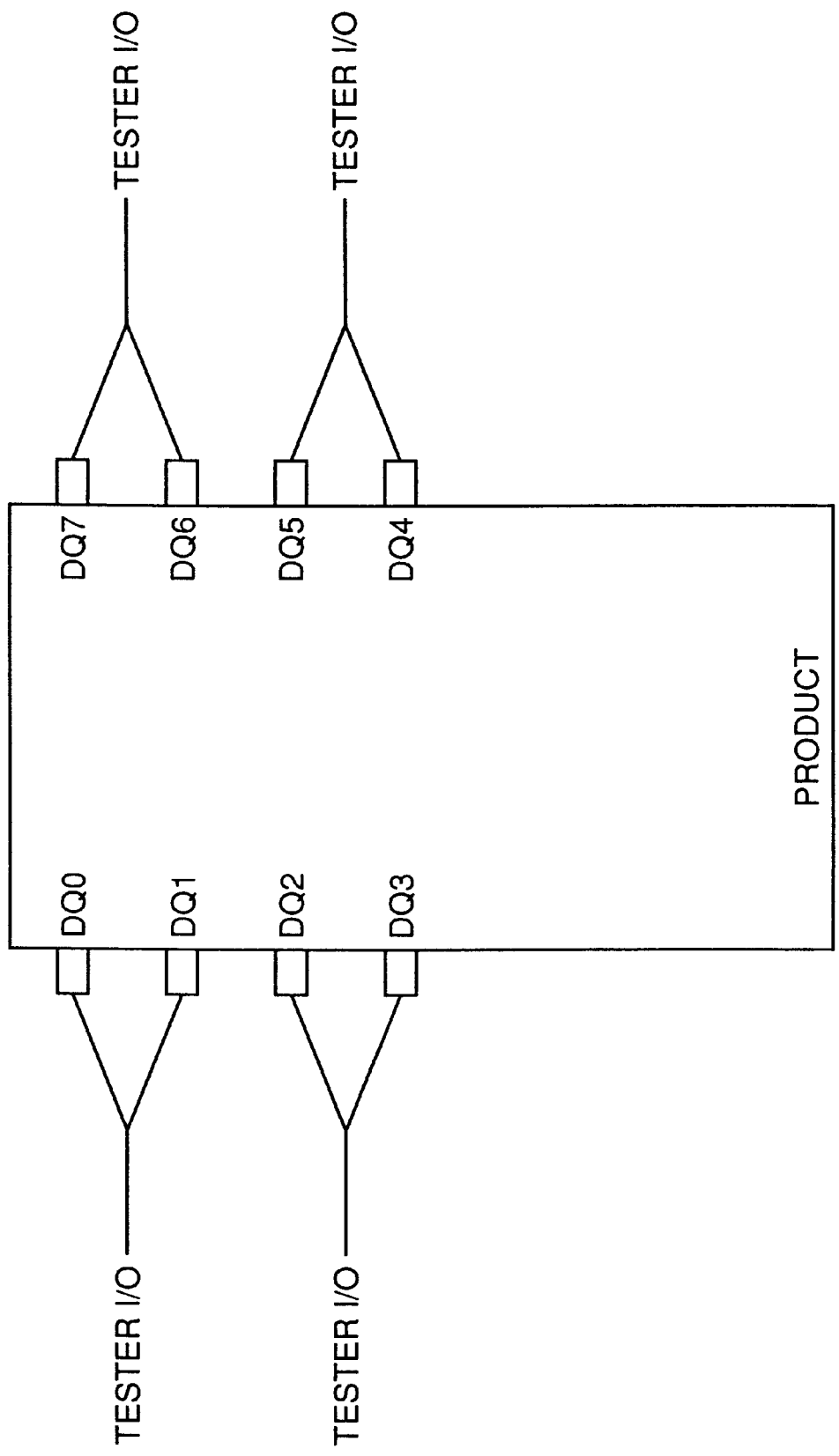
FIG. 13 is an outline view of a semiconductor memory device according to a third embodiment of the present invention.

The third embodiment of the present invention will now be described. Referring to FIG. 13, a semiconductor memory device of the x8-bit word configuration has eight input/output terminals DQ0–7, of which input/output terminals DQ0 and 1, DQ2 and 3, DQ4 and 5, and DQ6 and 7 are short-circuited respectively and connected to respective I/Os of a tester. In other words, every two out of eight input/output terminals DQ0–7 are short-circuited and connected to respective one I/O terminal of the tester, to perform a data reading test.

Figure 14:
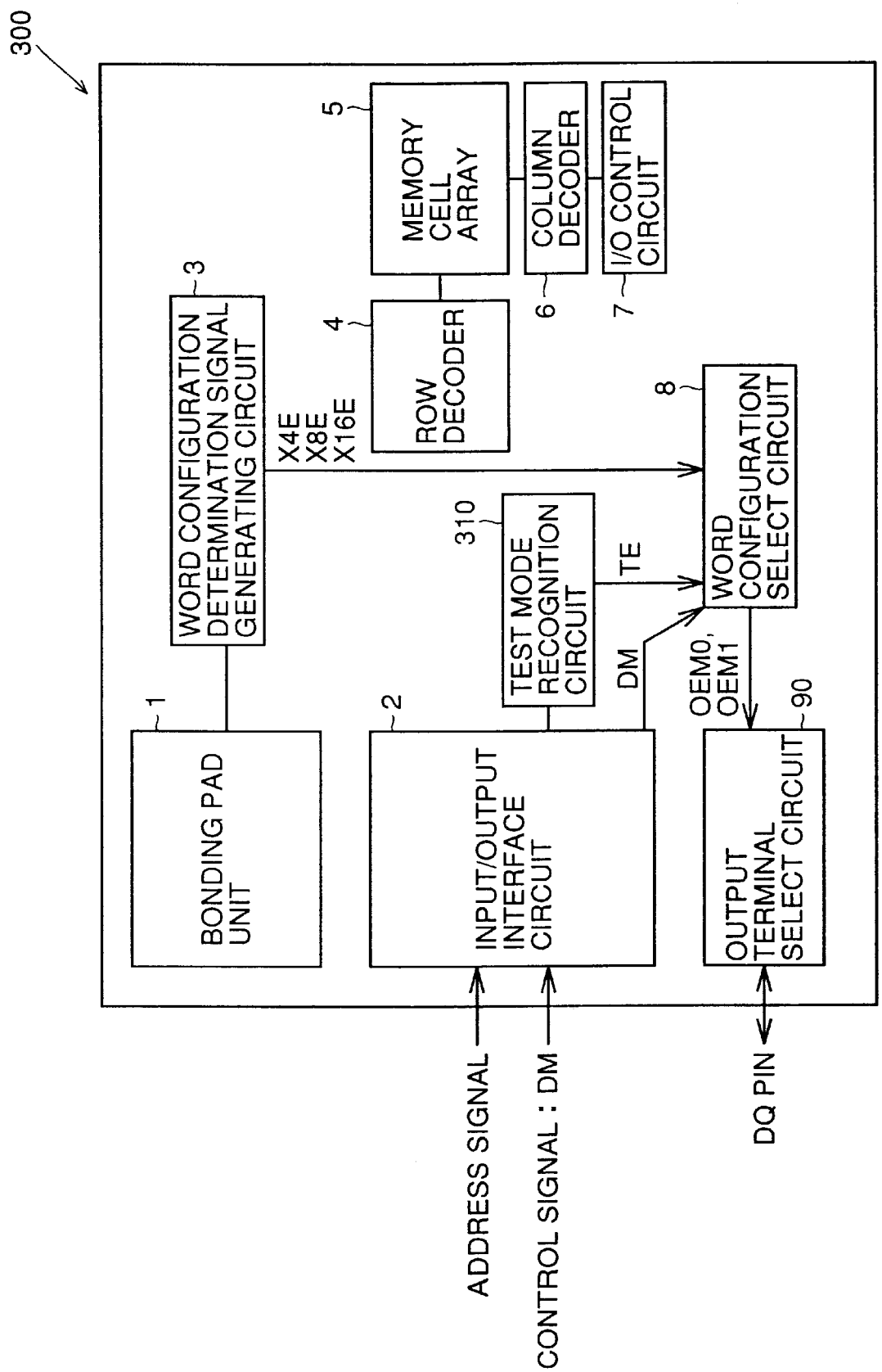
FIG. 14 is a schematic block diagram of the semiconductor memory device according to the third embodiment.

Referring to FIG. 14, the semiconductor memory device 300 according to the third embodiment is identical to semiconductor memory device 10 shown in FIG. 1, except that input/output terminal select circuit 9 is replaced by an output terminal select circuit 90 and a test mode recognition circuit 310 is added thereto. Test mode recognition circuit 310, when receiving row address strobe signal /RAS=L level, column address strobe signal /CAS=L level, mode entry signal ME=L level and also an address signal of a particular value from input/output interface circuit 2, causes semiconductor memory device 300 to move to a test mode, and outputs test mode signal TE activated (to an H level) to word configuration select circuit 8. In the non-test mode, test mode recognition circuit 310 outputs test mode signal TE inactivated (to an L level) to word configuration select circuit 8.

Input/output interface circuit 2 receives a data mask signal DM and outputs the data mask signal DM to word configuration select circuit 8.

Word configuration select circuit 8 selects the x8-bit word configuration for semiconductor memory device 300, based on word configuration determination signal [x8E] from word configuration determination signal generating circuit 3, as described above. Word configuration select circuit 8 also generates output terminal select signals OEM0, 1, based on test mode signal TE from test mode recognition circuit 310 and data mask signal DM from input/output interface circuit 2.

Figure 15:
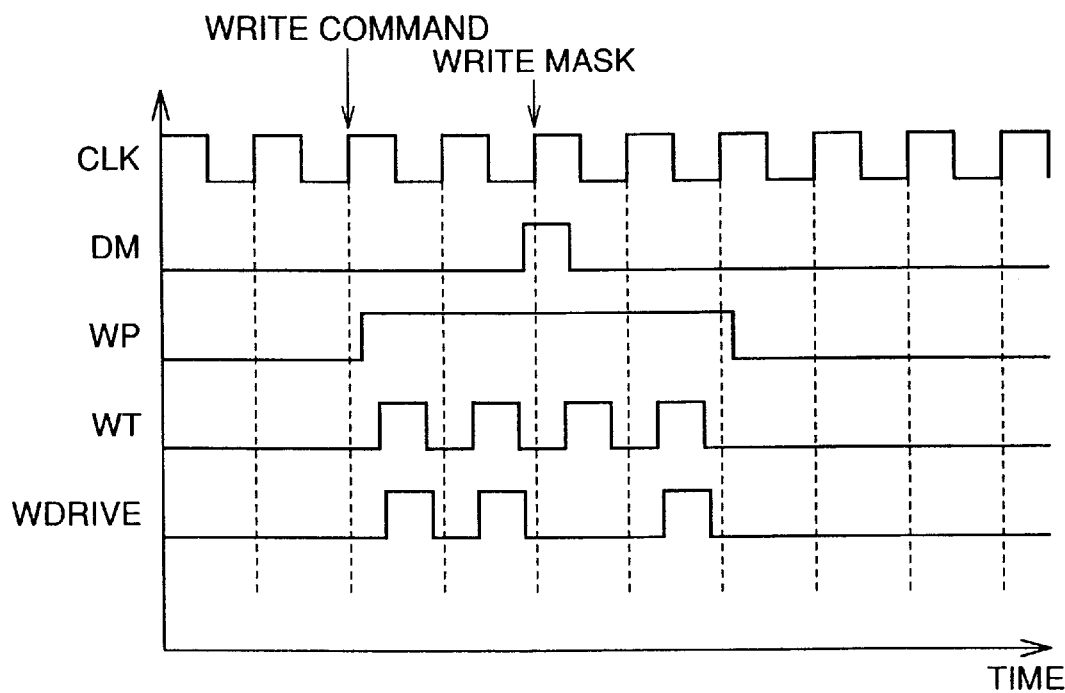
FIG. 15 is a timing chart of signals in a writing operation.

Referring to FIG. 15, data mask signal DM will be described. Data mask signal DM is a signal for masking a write operation. A writing period signal WP is activated to an H level after a write command is input in synchronization with a clock CLK, and is inactivated to an L level after receiving clocks CLK of a burst length. A write trigger signal WT operates when docks CLK are received during the time period when writing period signal WP is at an H level. A write drive signal WDRIVE operates in synchronization with write trigger signal WT while data mask signal DM is at an L level, and writes data into memory cells. When data mask signal DM is at an H level, write drive signal WDRIVE does not synchronize with write trigger signal WT and writes no data to memory cells. In the third embodiment, after entering the test mode, output terminal select signals a OEM0, 1 are switched using the signal, e.g., data mask signal DM, that is not directly associated with the read operation.

Figure 16:
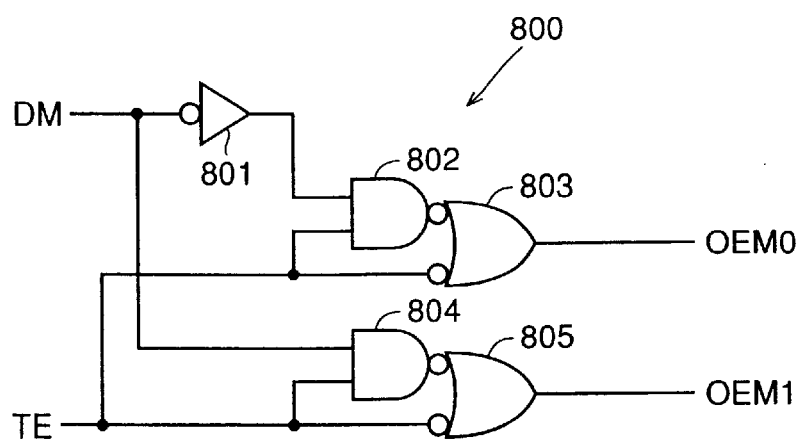
FIG. 16 is a circuit diagram of an output circuit select signal generating circuit.

Word configuration select circuit 8 includes output terminal select signal generating circuit 800 shown in FIG. 16. Output terminal select signal generating circuit 800 includes an inverter 801, AND gates 802, 804, and NOR gates 803, 805. When test mode signal TE is active and data mask signal DM is active, i.e., when TE=H level and DM=H level, then OEM0=L level and OEM1=H level. When TE=H level and DM=L level, then OEM0=H level and OEM1=L level.

When test mode signal TE is at an L level, output terminal select signals OEM0, 1 both attain an H level regardless of data mask signal DM.

Figure 17:
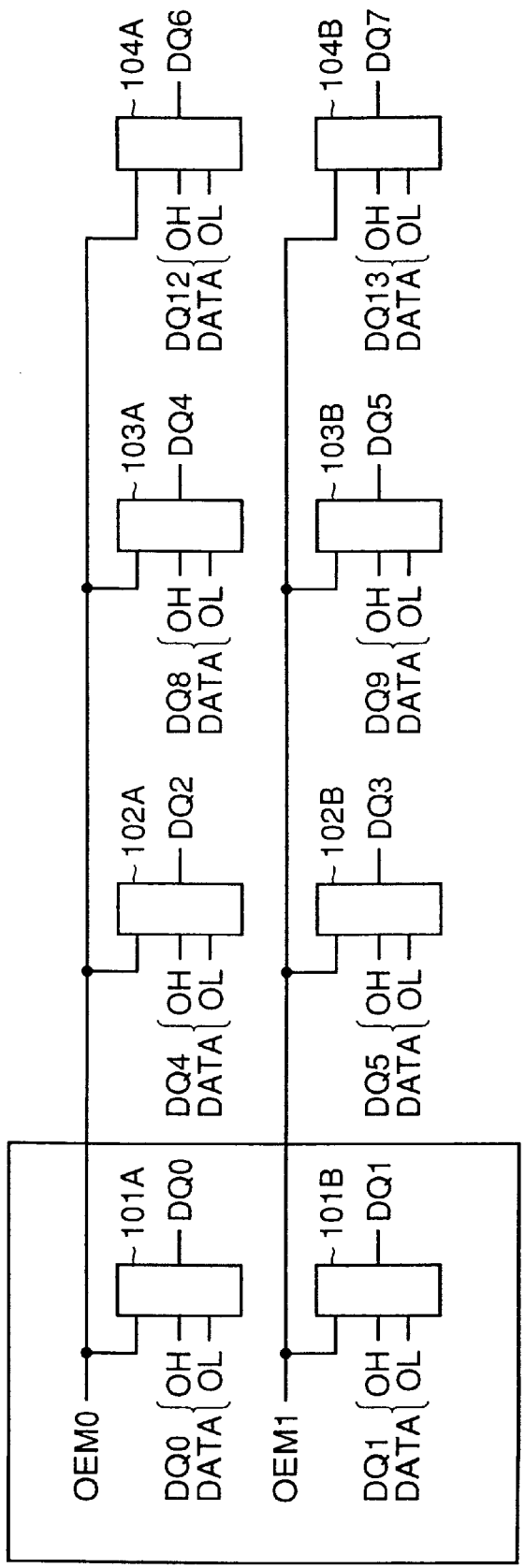
FIG. 17 is a circuit diagram of an output terminal select circuit.

Output terminal select circuit 90 has output circuits 101A, 101B, 102A, 102B, 103A, 103B, 104A and 104B, as shown in FIG. 17. Output circuits 101A and 101B are connected to input/output terminals DQ0 and 1, respectively, which terminals are short-circuited in a test mode. Output circuits 102A and 102B are respectively connected to input/output terminals DQ2 and 3, which are short-circuited in the test mode. Output circuits 103A and 103B are respectively connected to input/output terminals DQ4 and 5, which are short-circuited in the test mode. Output circuits 104A and 104B are respectively connected to input/output terminals DQ6 and 7, which are short-circuited in the test mode.

Output circuits 101A, 102A, 103A and 104A are activated when output terminal select signal OEM0 is at an H level. Output circuits 101B, 102B, 103B and 104B are activated when output terminal select signal OEM1 is at an H level.

Output circuits 101A, 101B, 102A, 102B, 103A, 103B, 104A and 104B each have a configuration as shown in FIG. 12 and output data of either an H level or an L level from its input/output terminal depending on the levels, H or L, of data OH, OL.

Figure 18:
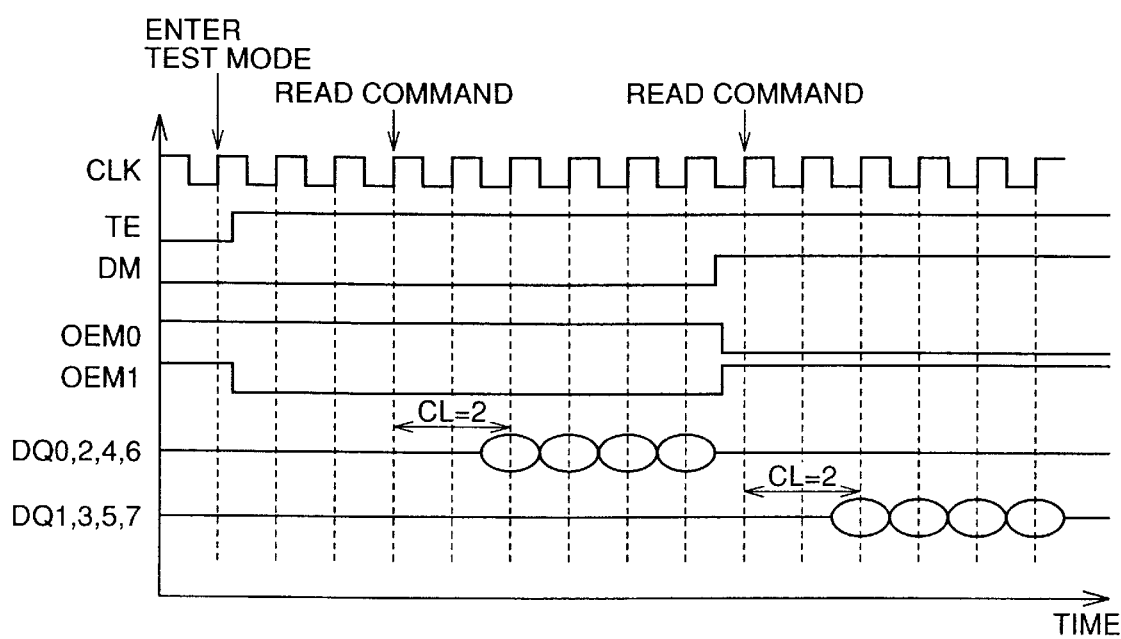
FIG. 18 is a timing chart of signals in a test mode according to the third embodiment.

Referring to FIGS. 17 and 18, when externally supplied test mode designating signals are input in synchronization with clock CLK, test mode signal TE is activated. Here, if data mask signal DM of an L level is input, output terminal select signal generating circuit 800 activates only output terminal select signal OEM0 (OEM0=H level, OEM1=L level). Thus, output circuits 101A, 102A, 103A and 104A of output terminal select circuit 90 are activated, data are output to input/output terminals DQ0, 2, 4 and 6, and the output data are examined. After the activation of test mode signal TE, if data mask signal DM at an H level is input, output terminal select signal generating circuit 800 activates only output terminal select signal OEM1 (OEM0=L level, OEM1=H level). Thus, output circuits 101B, 102B, 103B and 104B of output terminal select circuit 90 are activated, data are output to input/output terminals DQ1, 3, 5 and 7, and the output data are examined. A CAS latency CL when data are output from input/output terminals DQ0–7 are set to 2.

In the normal operation mode, by activating both output terminal select signals OEM0 and 1, output circuits 101A, 101B, 102A, 102B, 103A, 103B, 104A and 104B are all activated, and thus, data can be output from all output terminals DQ0–7.

Thus, in semiconductor memory device 300, by inputting data mask signal DM either at an H level or an L level after test mode recognition circuit 310 activates test mode signal TE in response to reception of the externally supplied test mode designating signals, it is possible to activate output circuits 101A, 101B, 102A, 102B, 103A, 103B, 104A, 104B by half of them as a group of output circuits 101A, 102A, 103A and 104A or a group of output circuits 101B, 102B, 103B and 104B, and thus, data can be sequentially output from input/output terminals DQ0, 2, 4, 6 and input/output terminals DQ1, 3, 5, 7. As a result, data can be read out from semiconductor memory device 300 having eight input/output terminals using four I/Os of the tester. Therefore, it is possible to perform data reading at the test with a reduced number, 4 from 8 in this case, of input/output terminals.

The present embodiment has been described above, taking the case of reading data from the semiconductor memory device having eight input/output terminals DQ0–7 by short-circuiting respective two input/output terminals. However, if test mode signal TE and data mask signal DM are used to generate four output terminal select signals OEM0–3, it is possible to read data from a semiconductor memory device having 16 input/output terminals DQ0–15 by short-circuiting respective four input/output terminals. Therefore, the third embodiment is also applicable to the semiconductor memory device having 16 input/output terminals.

As described above, according to the configuration of the third embodiment, data can be read from a semiconductor memory device in the test mode through a reduced number of output terminals. Thus, it becomes possible to mount a larger number of semiconductor memory devices on a tester at one time, thereby improving the throughput of the test of semiconductor memory devices.

Fourth Embodiment

Figure 19:
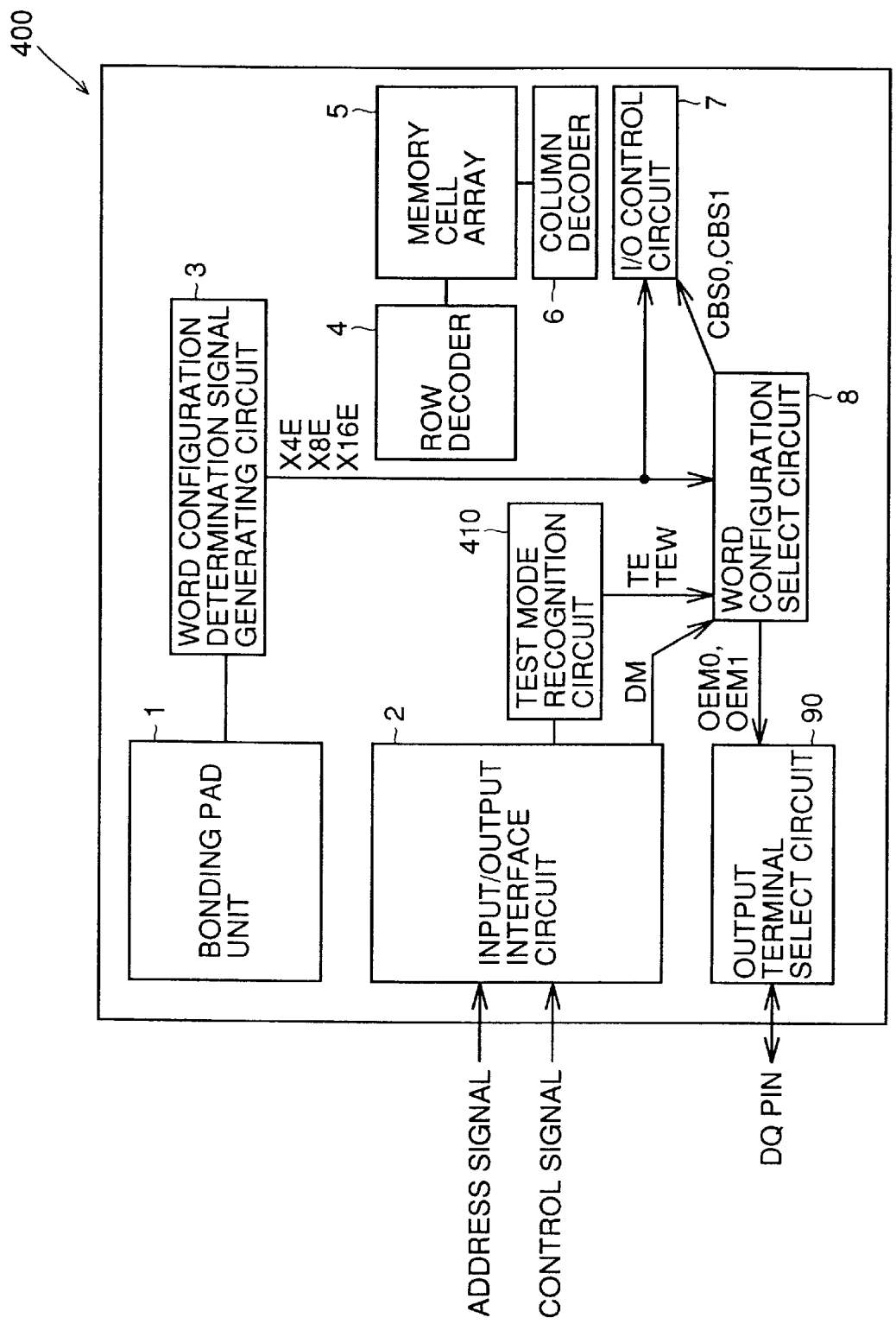
FIG. 19 is a schematic block diagram of a semiconductor memory device according to a fourth embodiment of the present invention.

The fourth embodiment of the present invention will now be described. In the first through third embodiments, data reading from a memory cell array in a test mode has been described. In the fourth embodiment, data writing to the memory cell array in the test mode will be described. Referring to FIG. 19, the semiconductor memory device 400 is identical to semiconductor memory device 10 shown in FIG. 1, except that input/output terminal select circuit 9 is replaced by an output terminal select circuit 90 and a test mode recognition circuit 410 is added thereto.

Test mode recognition circuit 410, when receiving row address strobe signal /RAS=L level, column address strobe signal /CAS=L level, mode entry signal ME=L level, and an address signal of a particular value from input/output interface circuit 2, causes semiconductor memory device 400 to move to a test mode. For writing data to memory cell array 5, test mode recognition circuit 410 outputs a test mode signal TEW activated (to an H level) to word configuration select circuit 8. In the non-test mode, test mode recognition circuit 410 outputs test mode signal TEW inactivated (to an L level) to word configuration select circuit 8.

Word configuration select circuit 8 selects the x8-bit word configuration for semiconductor memory device 400 according to word configuration determination signal [x8E] from word configuration determination signal generating circuit 3 as described above. Word configuration select circuit 8 also generates write driver select/drive signals CBS0, 1 based on test mode signal TEW from test mode recognition circuit 410, column address signal CA9 input from input/output interface circuit 2 and word configuration determination signal [x8E] from word configuration determination signal generating circuit 3.

Figure 20:
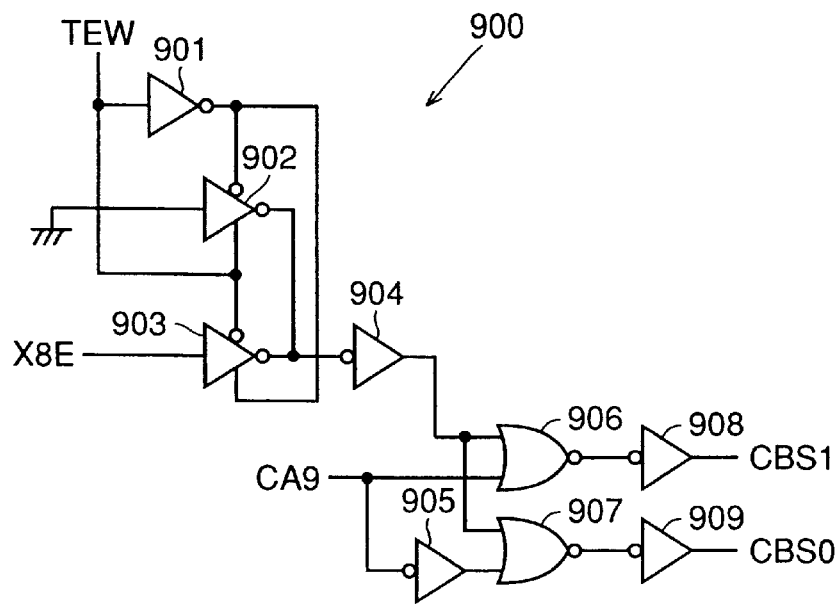
FIG. 20 is a circuit diagram of a write driver select/drive signal generating circuit.

Word configuration select circuit 8 includes a write driver select/drive signal generating circuit 900 shown in FIG. 20. Write driver select/drive signal generating circuit 900 includes an inverter 901, clocked inverters 902, 903, inverters 904, 905, NOR gates 906, 907 and inverters 908, 909. Write driver select/drive signal generating circuit 900 receives test mode signal TEW from test mode recognition circuit 410, word configuration determination signal [x8E] from word configuration determination signal generating circuit 3, and column address signal CA9 input from input/output interface circuit 2.

In the fourth embodiment, data writing into semiconductor memory device 400 in the test mode is performed using the x8-bit word configuration, which is the same as the word configuration for use in the normal operation mode. Thus, input to write driver select/drive signal generating circuit 900 are word configuration determination signal [x8E] of an H level, test mode signal TEW of an H level and column address signal CA9 either at an H level or an L level. When receiving column address signal CA9 of an L level, write driver select/drive signal generating circuit 900 outputs write driver select/drive signal CBS0 of an H level and write driver select/drive signal CBS1 of an L level, thereby activating only write driver select/drive signal CBS0. When receiving column address signal CA9 of an H level, write driver select/drive signal generating circuit 900 outputs write driver select/drive signal CBS0 of an L level and write driver select/drive signal CBS1 of an H level, thereby activating only write driver select/drive signal CBS1. In other words, write driver select/drive signal generating circuit 900 activates either one of write driver select/drive signals CBS0, 1 according to column address signal CA9, as shown in the fifth and sixth rows of Table 2.

TABLE 2

| CA9 | X8E | TEW | CBS0 | CBS1 |
|-----|-----|-----|------|------|
| L | L | L | H | L |
| H | L | L | L | H |
| L | H | L | H | H |
| H | H | L | H | H |
| L | H | H | H | L |
| H | H | H | L | H |

In the case where test mode signal TEW is inactive and semiconductor memory device 400 is to be used as that of the x8-bit word configuration, then write driver select/drive signal generating circuit 900 receives word configuration determination signal [x8E] of an H level and test mode signal TEW of an L level. In this case, regardless of the level. (H or L) of column address signal CA9, write driver select/drive signals CBA0, 1 are both at an H level (see third and fourth rows of Table 2).

Further, in the case where test mode signal TEW is inactive and semiconductor memory device 400 is to be used as that of the x4-bit word configuration, then write driver select/drive signal generating circuit 900 receives word configuration determination signal [x8E] of an L level and test mode signal TEW of an L level. At this time, if column address signal CA9 is at an L level, write driver select/drive signal CBA0 attains an H level and write driver select/drive signal CBS1 attains an L level, and thus, only write driver select/drive signal CBS1 is activated (see first row of Table 2). If column address signal CA9 is at an H level, write driver select/drive signal CBA0 attains an L level and write driver select/drive signal CBS1 attains an H level, and only write driver select/drive signal CBS0 is activated (see second row of Table 2).

Figure 21A:
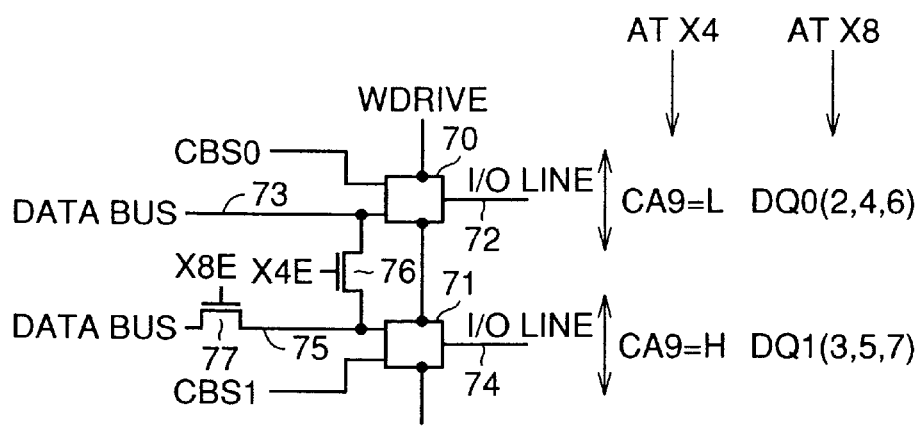
FIG. 21A is a wiring diagram of data buses, write drivers and input/output lines.
Figure 21B:
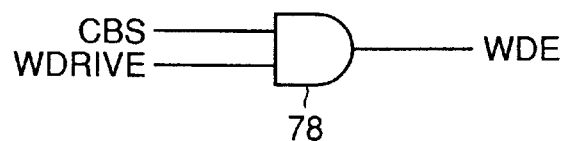
FIG. 21B is a circuit diagram illustrating the way of driving the write driver in FIG. 21A.

Referring to FIGS. 21A and 21B, I/O control circuit 7 includes write drivers 70, 71, each of which is made of an AND gate 78, as shown in FIG. 21B. When write driver select/drive signal CBS at an H level and write drive signal WDRIVE at an H level are input, drive signal WDE at an H level is output, and the driver is activated. Specifically, write driver 70 is activated when write driver select/drive signal CBS0 at an H level and write drive signal WDRIVE at an H level are input, and inputs data on data bus 73 to I/O line 72. Write driver 71 is activated when receiving write driver select/drive signal CBS1 at an H level and write drive signal WDRIVE at an H level, and inputs data on data bus 75 to I/O line 74. Connected between data bus 73 and data bus 75 is an N channel MOS transistor 76, which is turned on/off by word configuration determination signal [x4E]. An N channel MOS transistor 77 that is turned on/off by word configuration determination signal [x8E] is connected to data bus 75 in series.

Figure 22:
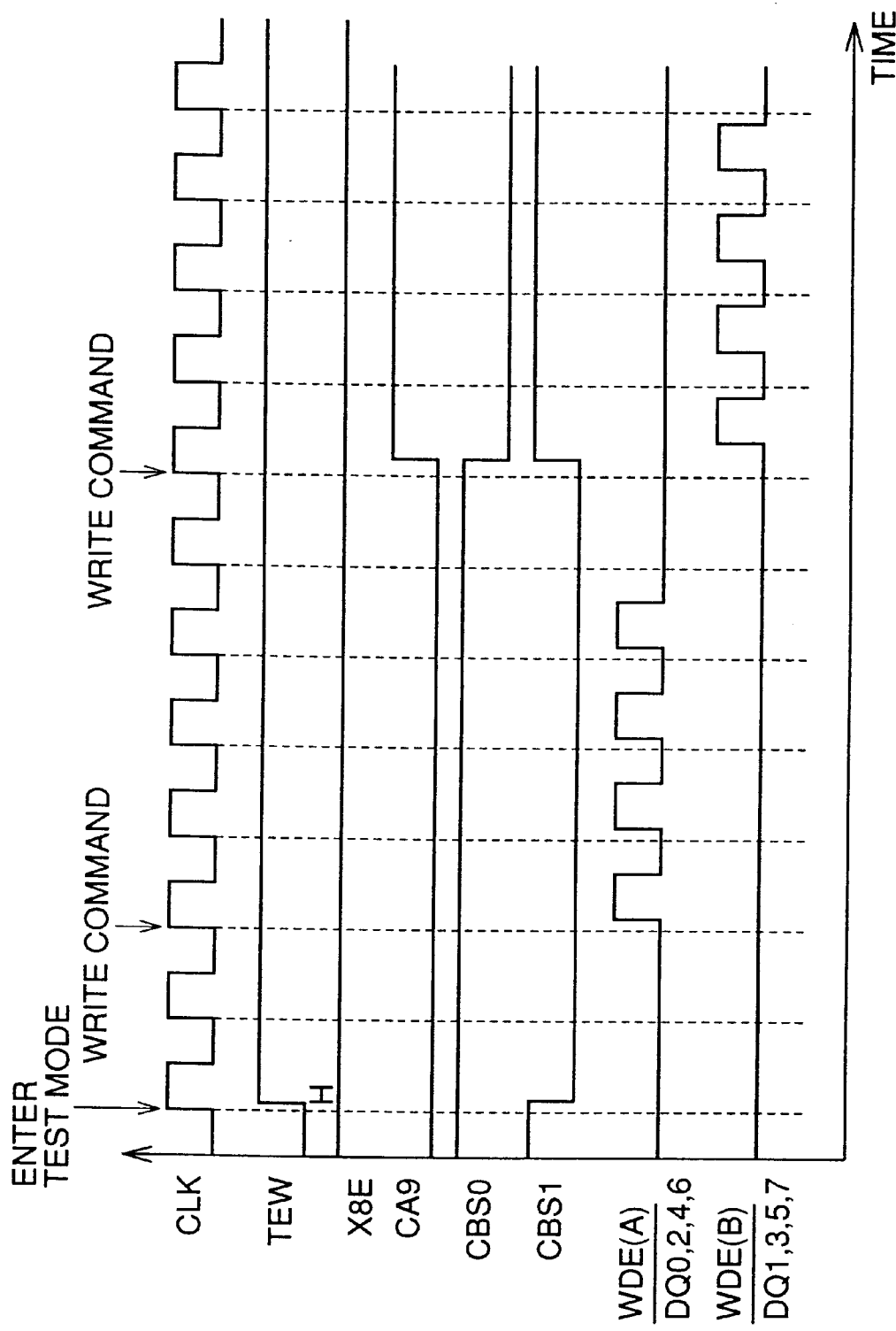
FIG. 22 is a timing chart of signals in a test mode according to the fourth embodiment.
Figure 23:
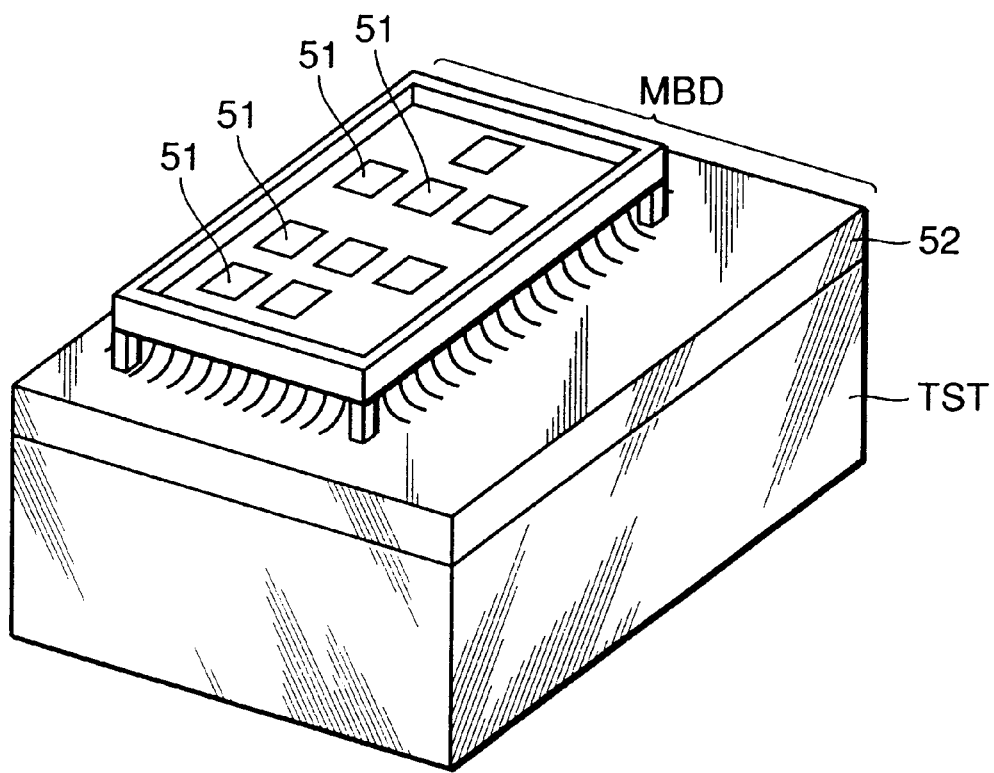
FIG. 23 is a perspective view of a memory tester.

Referring to FIGS. 21A, 21B and 22, data is to be written into memory cell array 5 in the test mode, using semiconductor memory device 400 as that of x8-bit word configuration. In this case, write driver select/drive signal generating circuit 900 receives column address signal CA9 either at an H level or an L level from input/output interface circuit 2, test mode signal TEW at an H level from test mode recognition circuit 410, and word configuration determination signal [x8E] of an H level from word configuration determination signal generating circuit 3, and I/O control circuit 7 receives word configuration determination signal [x4E] of an L level and word configuration determination signal [x8E] of an H level from word configuration determination signal generating circuit 3, and write drive signal WDRIVE from input/output interface circuit 2. Thus, in I/O control circuit 7, N channel MOS transistor 76 is turned off and N channel MOS transistor 77 is turned on. When write driver select/drive signal CBS0 that was activated corresponding to column address signal CA9 at an L level is input from write driver select/drive signal generating circuit 90, write driver 70 is activated, and it inputs data received from data bus 73 to I/O line 72. Thus, data is written into memory cells that are supposed to output data to input/output terminals DQ0, 2, 4, 6. When write driver select/drive signal CBS1 that was activated in response to column address signal CA9 at an H level is input from write driver select/drive signal generating circuit 900, write driver 71 is activated and inputs data received from data bus 75 to I/O line 74. Thus, data is written into memory cells that are supposed to output data to input/output terminals DQ1, 3, 5, 7. Although column address signal CA9 is an address signal prohibited in the x8-bit word configuration, it can be used to write data into each of output terminals DQ0, 1, DQ2, 3, DQ4, 5, and DQ6, 7, independently from each other, respective two of which are being short-circuited in the test mode for reading data therefrom.

After data has thus been written into memory cells, the method described in the third embodiment is used to short-circuit respective two output terminals to read data from each memory cell. Thus, word configuration select circuit 8 includes output terminal select signal generating circuit 800 as shown in FIG. 16, and output terminal select circuit 90 includes output circuits 101A, 101B, 102A, 102B, 103A, 103B, 104A and 104B as shown in FIG. 17. Test mode recognition circuit 410 activates test mode signal TE to output to word configuration select circuit 8. Input/output interface circuit 2 inputs data mask signal DM and outputs it to word configuration select circuit 8. In response, output terminal select signal generating circuit 800 included in word configuration select circuit 8 generates output terminal select signals OEM0, 1 according to test mode signal TE and data mask signal DM, and outputs the generated signals to output terminal select circuit 90. Thereafter, data is read out using the method described in the third embodiment.

In the case where test mode signal TEW is inactive and semiconductor memory device 400 is used as that of x8-bit word configuration, I/O control circuit 7 receives word configuration determination signal [x4] at an L level and word configuration determination signal [x8] at an H level from word configuration determination circuit 3, and also receives write driver select/drive signals CBS0, 1 at an H level or an L level, so that N channel MOS transistor 76 is turned off and N channel MOS transistor 77 is turned on. Thus, write driver, 70 or 71, is activated in response to activated one of write driver select/drive signals, CBS0 or CBS1. Activated write driver 70 (or 71) inputs data on data bus 73 (or 75) to I/O line 72 (or 74), whereby data writing is carried out. In this case, write driver select/drive signals CBS0, 1 are selectively activated by column address signal CA9 as described above. Thus, it becomes possible to select and drive write drivers 70, 71 by column address signal CA9.

Figure 6:
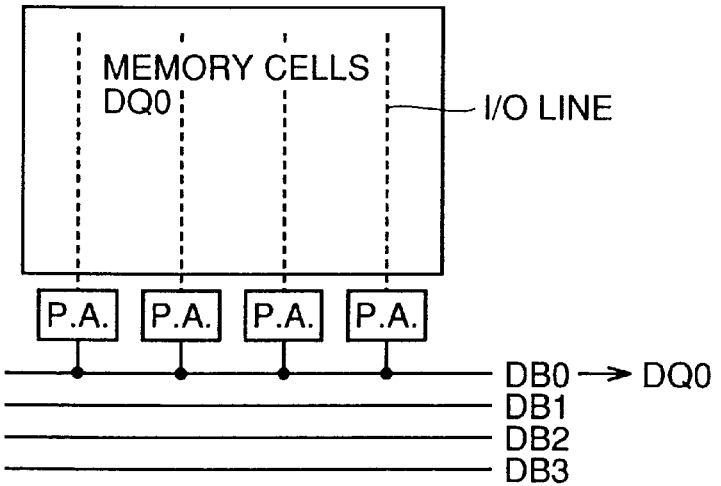
FIG. 6 schematically shows relations between memory cells and input/output terminals in the case of x4-bit word configuration.
Figure 7:
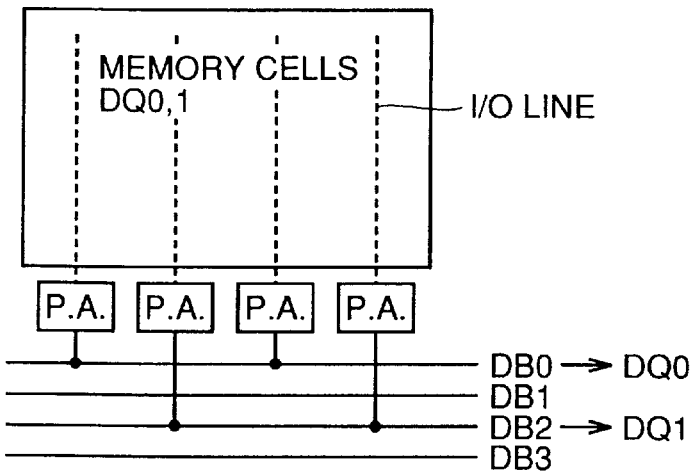
FIG. 7 schematically shows relations between memory cells and input/output terminals in the case of x8-bit word configuration.

In the case where test mode signal TEW is inactive and semiconductor memory device 400 is being utilized as that of x4-bit word configuration, I/O control circuit 7 receives word configuration determination signal [x4] at an H level and word configuration determination signal [x8] at an L level from word configuration determination signal generating circuit 3, and also receives write driver select/drive signals CBS0, 1 either at an H level or an L level, so that N channel MOS transistor 76 is turned on and N channel MOS transistor 77 is turned off. Thus, write driver 70 (or 71) is activated in response to activated write driver select/drive signal CBS0 (or CBS1), and inputs data on data bus 73 to I/O line 72 (or 74) for data writing. Accordingly, by switching the word configuration from x8 bits to x4 bits, as shown in FIGS. 6 and 7, output terminals DQ0, 1 in the x8-bit word configuration are modified to output terminal DQ0 in the x4-bit word configuration, and data writing is carried out. Likewise, other output terminals DQ2, 3, DQ4, 5 and DQ6, 7 in the x8-bit word configuration are respectively modified to output terminals DQ1, DQ2 and DQ3 in the x4-bit word configuration, and data writing is carried out. In this case, write driver select/drive signals CBS0, 1 are selectively activated by column address signal CA9 as described above. Thus, it becomes possible to select and drive write drivers 70, 71 by column address signal CA9.

The present embodiment has been described above for the semiconductor memory device having the x8-bit word configuration in the normal operation mode. However, the fourth embodiment is also applicable to a semiconductor memory device having the x16-bit word configuration if a write driver select/drive signal generating circuit generating four write driver select/drive signals CBS0-3 based on test mode signal TEW, word configuration determination signals [x8], [x16] and column address signal CA9 is employed.

As described above, according to the configuration of the fourth embodiment, it is possible to write data into output terminals DQ0, 1, DQ2, 3, DQ4, 5, and DQ6, 7, respectively and independently from each other, which terminals are being short-circuited for data reading in the test mode. Thus, a failure due to cross interference between short-circuited output terminals DQ0 (DQ2, 4, or 6) and DQ1 (DQ3, 5, or 7) can be examined. Further, the number of I/Os of the tester for use in the test mode can be reduced compared to the number of input/output terminals used in the normal operation mode. Thus, a larger number of semiconductor memory devices can be mounted on the tester at the same time, so that the throughput of the semiconductor memory device testing is improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device allowing selection of desired one of a plurality of word configurations, comprising:

a test mode recognition circuit inactivating a test mode signal in a normal operation mode and activating said test mode signal in response to an externally supplied test mode designating signal;

a word configuration select circuit selecting a word configuration for use in the normal operation mode from said plurality of word configurations when the inactive test mode signal is input from said test mode recognition circuit and selecting a word configuration that has a smaller number of bits than the word configuration for use in the normal operation mode from said plurality of word configurations when the active test mode signal is input from said test mode recognition circuit; and a terminal for inputting data to and outputting data from a memory cell array based on the word configuration selected by said word configuration select circuit.

2. The semiconductor memory device according to claim 1, further comprising:

a word configuration determination signal generating circuit generating a first word configuration determination signal when the inactive test mode signal is input from said test mode recognition circuit and generating a second word configuration determination signal when the active mode test signal is input from said test mode recognition circuit; and said word configuration select circuit selecting the word configuration for use in the normal operation mode according to said first word configuration determination signal and selecting the word configuration that is smaller than the word configuration for use in the normal operation mode according to said second word configuration signal.

3. The semiconductor memory device according to claim 2, wherein said word configuration determination signal generating circuit generates, when said test mode signal is active, the second word configuration determination signal to fix the word configuration of said semiconductor memory device to a smallest word configuration among selectable said word configurations.

4. A semiconductor memory device, comprising:

m×n output terminals consisting of n short-circuited terminal groups each having m terminals being short circuited in a test mode, wherein m and n are positive integers;

a test mode recognition circuit inactivating a test mode signal in a normal operation mode and activating said test mode signal in response to an externally supplied test mode designating signal;

an output terminal select signal generating circuit generating, when said test mode signal is active, a first output terminal select signal for outputting data from n output terminals each selected from respective one of said n short-circuited terminal groups and generating, when said test mode signal is inactive, a second output terminal select signal for outputting data from said m×n output terminals; and an output terminal select circuit selecting said n output terminals according to said first output terminal select signal and selecting said m×n output terminals according to said second output terminal select signal.

5. The semiconductor memory device according to claim 4, wherein said test mode recognition circuit inactivates all of m test mode constituent signals which form said test mode signal in the normal operation and activates any of the m test mode constituent signals in response to the externally supplied test mode designating signal, said output terminal select signal generating circuit generates said first and second output terminal select signals, each formed of m output terminal select signals, based on said m test mode constituent signals, when any one of said m test mode constituent signals is activated, said first output terminal select signal being generated with only one of said m output terminal select signals corresponding to the activated test mode constituent signal being activated, and when all said m test mode constituent signals are inactivated, said second output terminal select signal being generated with all said m output terminal select signals being activated; and said output terminal select circuit selects, when said first output terminal select signal is input, n output terminals corresponding to the activated one output terminal select signal.

6. The semiconductor memory device according to claim 5, wherein said output terminal select circuit includes m×n output circuits connected to said m×n output terminals respectively, and, when said first output terminal select signal is input, activates n output circuits corresponding to said activated one output terminal select signal.

7. The semiconductor memory device according to claim 5, further comprising:

a word configuration determination signal generating circuit generating a word configuration determination signal to determine one word configuration from a plurality of word configurations; and a word configuration select circuit selecting a word configuration based on the signal from said word configuration determination signal generating circuit; and the number of said test mode constituent signals being determined based on the word configuration selected by said word configuration select circuit.

8. The semiconductor memory device according to claim 4, further comprising an interface for input of a data mask signal; and said output terminal select signal generating circuit generating said first and second output terminal select signals based on said test mode signal and said data mask signal.

9. The semiconductor memory device according to claim 8, further comprising:

a word configuration determination signal generating circuit generating a word configuration determination signal for determination of one word configuration from a plurality of word configurations; and a word configuration select circuit selecting a word configuration based on said word configuration determination signal;

said output terminal select signal generating circuit generating first and second output terminal select signals each formed of a plurality of output terminal select signals; and the number of output terminal select signals forming each of said first and second output terminal select signals is determined based on the word configuration selected by said word configuration select circuit.

10. A semiconductor memory device, comprising:

a word configuration determination signal generating circuit generating a word configuration determination signal for determination of a word configuration from a plurality of word configurations;

a test mode recognition circuit inactivating a test mode signal in a normal operation mode and activating the test mode signal in response to an externally supplied test mode designating signal;

a driver selectdrive signal generating circuit generating a driver select/drive signal for selecting and driving a write driver for use in writing data into a memory cell array, based on a column address signal prohibited in the normal operation mode, said test mode signal and said word configuration determination signal; and a first number, m, of write drivers each connected to respective one of m input/output terminals that are being short-circuited in the test mode;

when said test mode signal is activated, said word configuration determination signal generating circuit generating the word configuration determination signal for fixing the word configuration of said semiconductor memory device to the word configuration for use in the normal operation mode; and said driver select/drive signal generating circuit generating the driver select/drive signal for selecting and driving said m write drivers one by one.

11. The semiconductor memory device according to claim 10, wherein said driver select/drive signal generating circuit generates the driver select/drive signal allowing switching of the write driver being selected and driven, based on said column address signal.

12. The semiconductor device according to claim 10, further comprising:

m×n inpu/output terminals consisting of n short-circuited terminal groups each having m terminals being short-circuited in the test mode, wherein n is a second number;

an output terminal select signal generating circuit generating, when the test mode signal is active, a first output terminal select signal for outputting data from n input/output terminals each selected from respective one of said n short-circuited terminal groups, and generating, when said test mode signal is inactive, a second output terminal select signal for outputting data from said m×n input/output terminals; and an output terminal select circuit selecting said n input/output terminals according to said first output terminal select signal and selecting said m×n input/output terminals according to said second output terminal select signal.

* * * * *